US007256663B2

(12) United States Patent
Yasuda et al.

(10) Patent No.: US 7,256,663 B2
(45) Date of Patent: Aug. 14, 2007

(54) BALUN DEVICE, BALANCE FILTER DEVICE, AND WIRELESS COMMUNICATION APPARATUS

(75) Inventors: Hisahiro Yasuda, Nakamuroda Haruna-Machi (JP); Shinichi Sugiyama, Nakamuroda Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 54 days.

(21) Appl. No.: 11/049,049

(22) Filed: Feb. 2, 2005

(65) Prior Publication Data

US 2005/0184831 A1 Aug. 25, 2005

(30) Foreign Application Priority Data

Feb. 9, 2004 (JP) ............................ 2004-032306
Jun. 15, 2004 (JP) ............................ 2004-176900

(51) Int. Cl.
*H01P 5/10* (2006.01)
*H03H 7/42* (2006.01)

(52) U.S. Cl. ........................................ 333/26; 333/185

(58) Field of Classification Search .................. 333/25, 333/26, 185

See application file for complete search history.

(56) References Cited

U.S. PATENT DOCUMENTS 6,788,164 B2 * 9/2004 Maekawa et al. ............. 333/26
6,828,881 B2 * 12/2004 Mizutani et al. .............. 333/26
6,850,127 B2 * 2/2005 Sakakura et al. ............. 333/25

FOREIGN PATENT DOCUMENTS

JP 2003-087008 3/2003

* cited by examiner

*Primary Examiner*—Dean Takaoka
(74) *Attorney, Agent, or Firm*—Knobbe Martens Olson & Bear, LLP

(57) ABSTRACT

A balun device, a balance filter device, and a wireless communication apparatus are provided. An intermediate electrode is disposed between a balanced resonance electrode and a GND electrode. More specifically, the balun device includes a pair of GND electrodes formed on a dielectric layer, an unbalanced resonance electrode formed on a dielectric layer, and a balanced resonance electrode formed on a dielectric layer. The unbalanced resonance electrode and the balanced resonance electrode are disposed between the pair of GND electrodes by laminating the corresponding dielectric layers. The intermediate electrode is interposed between the balanced resonance electrode and the GND electrode positioned close to the balanced resonance electrode.

20 Claims, 19 Drawing Sheets

BALUN DEVICE, BALANCE FILTER DEVICE, AND WIRELESS COMMUNICATION APPARATUS

BACKGROUND OF THE INVENTION

1. Field of the Invention

The present invention generally relates to a balun device for performing unbalanced-to-balanced signal conversion, a balance filter device formed by integrating the balun device and a filter together, and a wireless communication apparatus integrating a balun device and a filter thereinto. More specifically, the invention relates to a balun device, a balance filter device, and a wireless communication apparatus, that can be effectively miniaturized.

2. Description of the Related Art

A typical wireless communication apparatus includes various radio frequency (RF) devices, such as an antenna, a filter, an RF switch, a power amplifier, an radio-frequency integrated circuit (RF-IC), and a balun device. Resonant devices, such as an antenna and a filter, handle unbalanced signals based on a ground potential, while a radio-frequency integrated circuit (RF-IC), which generates and processes radio frequency signals, handles balanced signals. Accordingly, a balun device, which serves as an unbalanced-to-balanced converter, is used for connecting the two types of devices.

Many balance filter devices formed by integrating a balun device and a filter together have been invented. Accordingly, the size of wireless communication apparatuses integrating such balance filter devices is becoming smaller. This type of balance filter device is disclosed in, for example, Japanese Unexamined Patent Application Publication No. 2003-087008. The balance filter device disclosed in this publication has a structure in which a filter designed by using ¼-wavelength resonators and a balun device are mounted on a dielectric substrate, and dielectric layers forming the filter and dielectric layers forming the balun device are laminated to integrate the filter and the balun device together.

The above-mentioned publication also discloses a structure in which a DC power layer is integrated into the balun device to allow an RF-IC to handle balanced signals superimposed on DC components, thereby achieving a further reduction in the balance filter device. In this publication, two structures concerning the arrangement of DC power layer have been proposed. In one structure, the DC power layer is disposed outside a ground (GND), as shown in FIGS. 15, and 25, and in the other structure, the DC power layer is disposed between the unbalanced terminal electrode of the balun device and the GND electrode.

However, in the structure in which the DC power layer is disposed outside the GND, due to a poor connectability between the DC power layer and the balanced resonance electrode, the provision of a DC-wiring through-hole for the GND electrode is required. Accordingly, the size of the balance filter device cannot be sufficiently reduced.

In the structure in which the DC power layer is disposed between the unbalanced terminal electrode and the GND electrode, the following problem in designing occurs. A large stray capacitance is generated between the unbalanced terminal electrode and the DC power layer so as to change the impedance. Accordingly, the impedance of the balun device when viewed from the filter is decreased, thereby making the matching of impedance difficult.

SUMMARY OF THE INVENTION

It is an object of the present invention among others to provide a balun device, a balance filter device, and a wireless communication apparatus, the size of which can be reduced efficiently while ensuring unbalanced-to-balanced conversion characteristics.

According to a first aspect of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; and an intermediate electrode disposed between the balanced resonance electrode and the GND electrode positioned close to the balanced resonance electrode.

The intervention of the intermediate electrode eases resonance characteristics of a stripline structure formed by the pair of GND electrodes, the unbalanced resonance electrode, and the balanced resonance electrode. Accordingly, as the material for the dielectric substrates, a material having a high dielectric constant ∈, for example, ∈80, can be used, and thus, the size of the balun device using a material having a high dielectric constant ∈ can be reduced over a balun device using a material having a low dielectric constant ∈.

Since a known balun device formed by laminating dielectric members has sensitive resonance characteristics, a material having a high dielectric constant ∈ cannot be used for such a balun device, thereby hampering a reduction in the size of the balun device. In an embodiment of the present invention, the resonance characteristics are intentionally eased by the intervention of the intermediate electrode so as to allow the use of a material having a high dielectric constant ∈, thereby reducing the size of the resulting balun device.

The reason for placing the intervention of the intermediate electrode between the balanced resonance electrode and the GND electrode in an embodiment of the present invention is as follows. For example, as disclosed in Japanese Unexamined Patent Application Publication No. 2003-087008, if the intermediate electrode is disposed close to the unbalanced side, a large stray capacitance is applied to the unbalanced resonance electrode to change the impedance of the balun device when viewed from the filter, thereby making the matching between the filter and the balun device difficult.

As the unbalanced resonance electrode and the balanced resonance electrode, stripline resonators, which are discussed below, or LC resonators may be used. It is, however, more preferable that the stripline resonators be used since the effect of easing resonance characteristics produced by the intervention of the intermediate electrode is more noticeable with the use of stripline resonators. Two types of stripline resonators, λ/2 resonators and λ/4 resonators, are well known, and either type can be used in an embodiment of the present invention.

The intermediate electrode may preferably include a connecting pattern for the balanced resonance electrode and a connecting pattern for an external source, thereby making it possible to supply a DC signal to an RF-IC via this intermediate electrode and the balanced resonance electrode. With this structure, DC supply means can be formed only by connecting the balun device to the RF-IC without the need to provide a DC supply circuit outside.

The balanced resonance electrode may preferably include a pair of resonance electrodes, and the intermediate electrode may be positioned such that it faces each of the resonance electrodes. With this configuration, the balance between the balanced terminals can be ensured.

The intermediate electrode may preferably be disposed at a position closer to the GND electrode than the balanced resonance electrode. With this configuration, the interference of the intermediate electrode with the balanced resonance electrode can be prevented.

According to a second aspect of the present invention, there is provided a balance filter device including: a filter unit being formed by laminating a plurality of dielectric substrates; and a balun unit being formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer. The unbalanced resonance electrode and the balanced resonance electrode are disposed between the pair of GND electrodes by laminating the dielectric layers. The filter unit is connected to the unbalanced resonance electrode of the balun unit. An intermediate electrode is disposed between the balanced resonance electrode and the GND electrode positioned close to the balanced resonance electrode. The word “connected” may mean physical or functional and direct or indirect connection.

The intermediate electrode is interposed between the GND electrode and the balanced resonance electrode, which is positioned opposite to the unbalanced resonance electrode connected to the filter unit. Accordingly, an impedance change when viewed from the filter unit can be suppressed, and thus, the effect of easing the resonance characteristics can be obtained in the balun unit.

The filter unit and the balun unit may preferably formed of the same type of dielectric material, thereby eliminating cumbersome procedures caused by the use of different types of materials, for example, eliminating the need to adjust the differential shrinkage caused by burning. A material having a high dielectric constant $\in$ can be used both for the filter unit and the balun unit, thereby making it possible to provide a smaller balance filter device.

According to the second aspect of the present invention, various features unique to the first aspect of the present invention can be combined.

According to a third aspect of the present invention, there is provided a wireless communication apparatus including: an antenna; a balance filter device; and a radio-frequency integrated circuit. The balance filter device includes: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit, and the radio-frequency integrated circuit is connected to the balanced resonance electrode. An intermediate electrode is disposed between the balanced resonance electrode and the GND electrode positioned close to the balanced resonance electrode.

With this configuration, the smaller balance filter device can be integrated into the connecting portion with the RF-IC, thereby reducing the size of the wireless communication apparatus.

A DC signal may preferably be supplied to the RF-IC via the intermediate electrode and the balanced resonance electrode. With this arrangement, a DC supply function can be integrated into the balance filter device, thereby reducing the size of the wireless communication apparatus.

According to a fourth aspect of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; and an intermediate electrode disposed between the balanced resonance electrode and the GND electrode. The balanced resonance electrode includes a pair of resonance electrodes, and the intermediate electrode is positioned such that it faces each of the pair of resonance electrodes. There is also provided a balance filter device including: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. An intermediate electrode is disposed between the balanced resonance electrode and the GND electrode, and the balanced resonance electrode includes a pair of resonance electrodes, and the intermediate electrode is positioned such that it faces each of the pair of resonance electrodes.

With this arrangement, the intermediate electrode can be disposed while ensuring the balance between a pair of balanced resonance electrodes.

According to a fifth aspect of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; and an intermediate electrode disposed between the balanced resonance electrode and the GND electrode such that the intermediate electrode is disposed at a position closer to the GND electrode than the balanced resonance electrode. The present invention also provided a balance filter device including: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. An intermediate electrode is disposed between the balanced resonance electrode and the GND electrode such that the intermediate electrode is disposed at a position closer to the GND electrode than the balanced resonance electrode.

With this configuration, the interference between the balanced resonance electrode and the intermediate electrode can be prevented.

According to a sixth aspect of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; and an intermediate electrode disposed between the unbalanced resonance electrode and the GND electrode such that the intermediate electrode is disposed at a position closer to the GND electrode than the unbalanced resonance electrode. The present invention also provides a balance filter device including: a filter unit being formed by laminating a plurality of dielectric substrates; and a balun unit being formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. An intermediate electrode is disposed between the unbalanced resonance electrode and the GND electrode such that the intermediate electrode is disposed at a position closer to the GND electrode than the unbalanced resonance electrode.

With this configuration, the interference between the unbalanced resonance electrode and the intermediate electrode can be prevented.

According to a seventh aspect of the present invention, there is provided a balance filter device including: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. The balanced resonance electrode includes a pair of resonance electrodes, and the pair of resonance electrodes being formed on different layers.

With this configuration, it is possible to prevent the disturbance of the balance of the balanced side when connecting the filter unit and the balun unit, thereby reducing the insertion loss. More specifically, due the presence of coupling electrodes between the filter unit and the balun unit, the phase balance of the balanced side is disturbed because of the influence of the stray capacitance. Thus, by differentiating the coupling distance of one balanced resonance electrode from that of the other balanced resonance electrode, the balance can be maintained.

According to an eighth aspect of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; and an intermediate electrode disposed between the GND electrode and one of the unbalanced resonance electrode and the balanced electrode such that the intermediate electrode is formed larger than the GND electrode. The present invention also provides a balance filter device including: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. An intermediate electrode is disposed between the GND electrode and one of the unbalanced resonance electrode and the balanced electrode such that the intermediate electrode is formed larger than the GND electrode.

With this configuration, the interference between the intermediate electrode and external electrodes can be prevented.

According to a ninth embodiment of the present invention, there is provided a balun device including: a pair of GND electrodes formed on a dielectric layer; an unbalanced resonance electrode formed on a dielectric layer; a balanced resonance electrode formed on a dielectric layer, the unbalanced resonance electrode and the balanced resonance electrode being disposed between the pair of GND electrodes by laminating the dielectric layers; an intermediate electrode disposed between the balanced resonance electrode and the GND electrode; and an inductor electrode disposed between the balanced resonance electrode and the intermediate electrode. The present invention also provides a balance filter device including: a filter unit formed by laminating a plurality of dielectric substrates; and a balun unit formed by laminating a plurality of dielectric substrates. The balun unit includes: a pair of GND electrodes formed on a dielectric layer; an unbalanced resonance electrode formed on a dielectric layer; and a balanced resonance electrode formed on a dielectric layer, the unbalanced resonance electrode and the balanced resonance electrode being disposed between the pair of GND electrodes by laminating the dielectric layers. The filter unit is connected to the unbalanced resonance electrode of the balun unit. An intermediate electrode is disposed between the balanced resonance electrode and the GND electrode, and an inductor electrode is disposed between the balanced resonance electrode and the intermediate electrode.

The inductor electrode may preferably include a connecting pattern for the balanced resonance electrode and a connecting pattern for an external source. With this configuration, DC can be supplied via the inductor electrode from the external source, and the undesired peaks can be shifted.

According to the present invention, the sizes of the balun device, the balance filter device, and the wireless communication apparatus can be reduced.

In all of the aforesaid aspects and embodiments, any element used in an aspect or embodiment can interchangeably be used in another aspect or embodiment unless such a replacement is not feasible or causes adverse effect. Further, the present invention can equally be applied to apparatuses and methods.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes.

DESCRIPTION OF THE PREFERRED EMBODIMENTS

The present invention is described in detail below with reference to the accompanying drawings through illustration of preferred embodiments. However, the present invention is not restricted to the disclosed embodiments, and various modifications can be made to the present invention.

Figure 1:
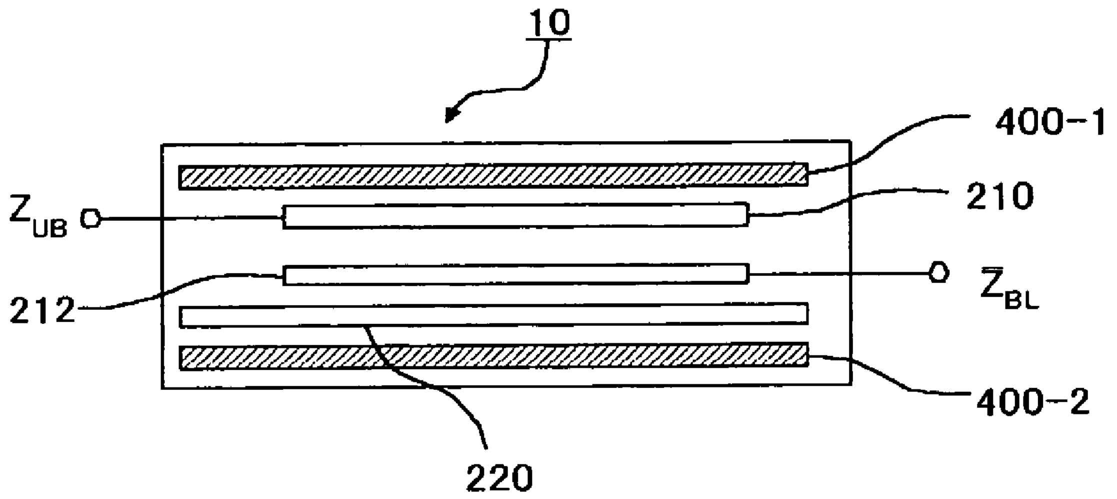
FIG. 1 is a sectional view illustrating the characteristics of a balun unit according to an embodiment of the present invention.

As shown in FIG. 1, in a balun device 10 constructed in accordance with an embodiment of the present invention, an unbalanced resonance electrode 210 and a balanced resonance electrode 212 are disposed between a pair of GND electrodes 400-1 and 400-2 so as to form a stripline structure.

In the balun device 10 shown in FIG. 1, an intermediate electrode 220 is disposed between the balanced resonance electrode 212 and the GND electrode 400-2 so as to ease resonance characteristics. It is desirable that the intermediate electrode 220 is formed longer than the balanced resonance electrode 212, as shown in FIG. 1, so that it intervenes between the balanced resonance electrode 212 and the GND electrode 400-2 along the entire lengths thereof.

The unbalanced resonance electrode 210 is connected to an unbalanced terminal Z<SUB>UB</SUB> of the balun device 10, while the balanced resonance electrode 212 is connected to a balanced terminal Z<SUB>BL</SUB> of the balun device 10. The unbalanced terminal Z<SUB>UB</SUB> and the balanced terminal Z<SUB>BL</SUB> serve as external terminals of the balun device 10.

When integrating the balun device 10 into a wireless communication apparatus, a filter is connected to the unbalanced terminal Z<SUB>UB</SUB> of the balun device 10, while an RF-IC is connected to the balanced terminal Z<SUB>BL</SUB> of the balun device 10.

Figure 2:
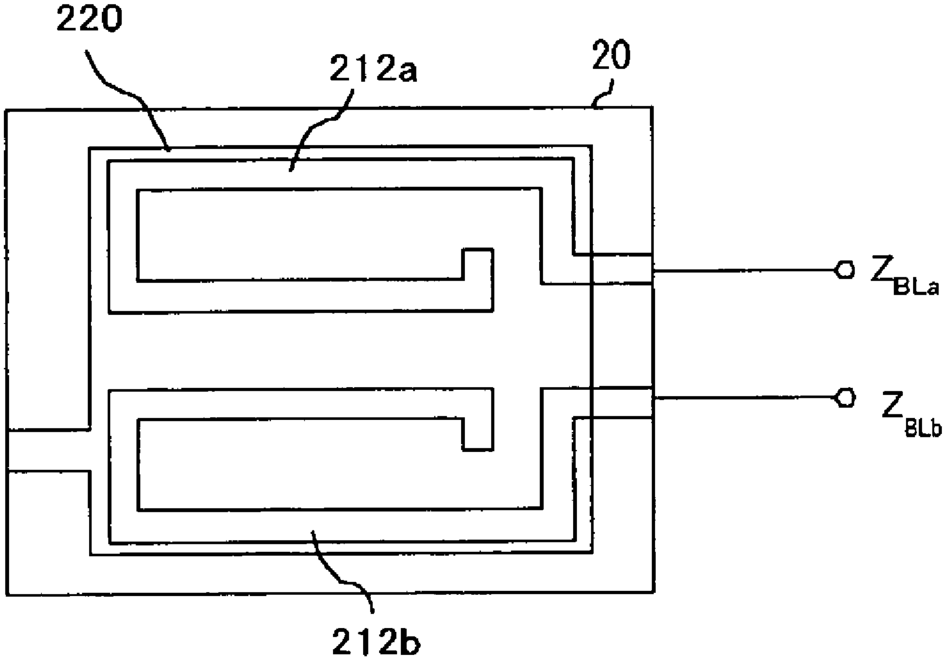
FIG. 2 is a plan view illustrating the positional relationship between a balanced resonance electrode and an intermediate electrode facing each other shown in FIG. 1.

FIG. 2 is a plan view illustrating the positional relationship between the balanced resonance electrode 212 and the intermediate electrode 220 shown in FIG. 1 facing each other. The balanced resonance electrode 212 is formed of, as shown in FIG. 2, a first λ/4 resonance electrode 212*a* and a second λ/4 resonance electrode 212*b*. The first and second λ/4 resonance electrodes 212*a* and 212*b* are formed on a dielectric substrate 20 as electrode patterns and are connected to balanced terminals Z<SUB>BLa</SUB> and Z<SUB>BLb</SUB>, respectively.

The intermediate electrode 220 shown in FIG. 1 is formed on a dielectric substrate different from the dielectric substrate 20 on which the first and second λ/4 resonance electrodes 212*a* and 212*b* are formed. The intermediate electrode 220 is disposed at a position, as shown in FIG. 2, so that it faces both the first and second λ/4 resonance electrodes 212*a* and 212*b*. In the example shown in FIG. 2, the end portions of the first and second λ/4 resonance electrodes 212*a* and 212*b* connected to the balanced terminals Z<SUB>BLa</SUB> and Z<SUB>BLb</SUB> are not overlapped with the intermediate electrode 220. However, the intermediate electrode 220 may be enlarged so as to face the end portions of the first and second λ/4 resonance electrodes 212*a* and 212*b*.

In the example shown in FIG. 2, the first and second λ/4 resonance electrodes 212*a* and 212*b* are formed on the same dielectric substrate 20. However, they may be formed on different dielectric substrates, and by adjusting the distances of the first and second λ/4 resonance electrodes 212*a* and 212*b* with the unbalanced resonance electrode 210 or the GND electrodes 400-1 and 400-2, balance between the balanced terminals Z<SUB>BLa</SUB> and Z<SUB>BLb</SUB> can be regulated.

Figure 3:
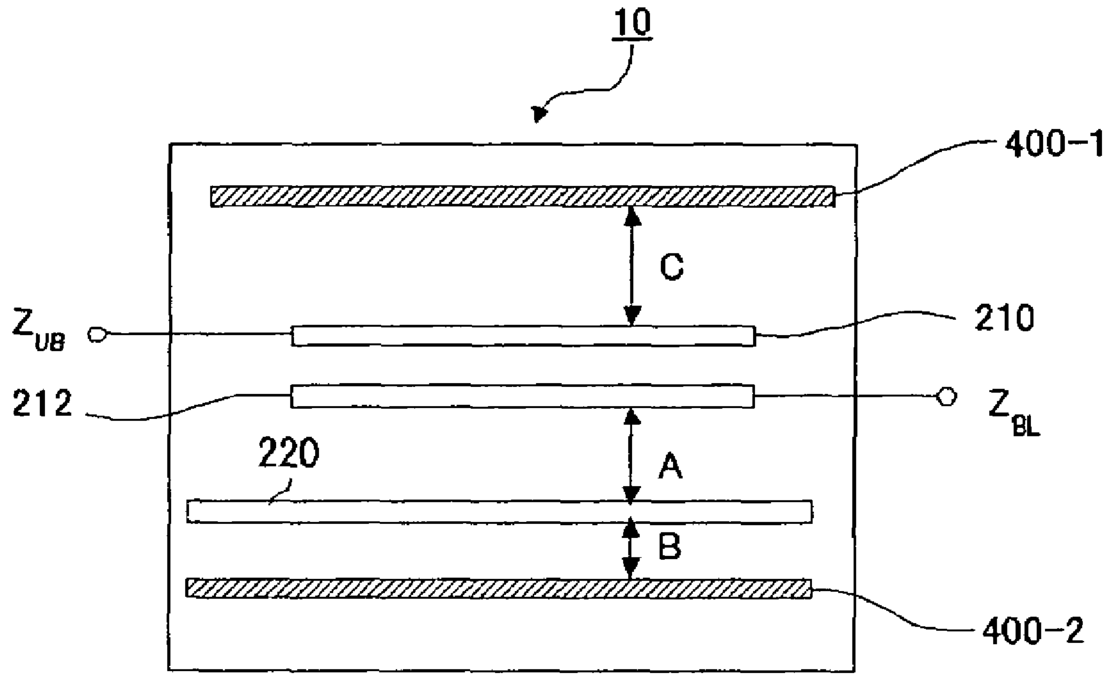
FIG. 3 is a sectional view illustrating the positional relationship in the direction in which the balanced resonance electrode and the intermediate electrode shown in FIG. 1 are laminated.

FIG. 3 is a sectional view illustrating the positional relationship in the direction in which the balanced resonance electrode 212 and the intermediate electrode 220 are laminated. When the distance between the balanced resonance terminal 212 and the intermediate electrode 220 is represented by A, and when the distance between the intermediate electrode 220 and the GND electrode 400-2 is indicated by B, the positional relationship A>B holds true. That is, it is desirable that the intermediate electrode 220 is positioned closer to the GND electrode 400-2 than the balanced resonance electrode 212. With this arrangement, the interference between the balanced resonance electrode 212 and the intermediate electrode 220 can be prevented.

Preferably, the distance C between the unbalanced resonance electrode 210 and the GND electrode 400-1 is greater than or equal to the distance A between the balanced resonance electrode 212 and the intermediate electrode 220, i.e., the positional relationship C≧A holds true. By setting the distance C between the unbalanced resonance electrode 210 and the GND electrode 400-1 to be large, desirable coupling between the unbalanced resonance electrode 210 and the balanced resonance electrode 212 can be obtained.

Figure 4:
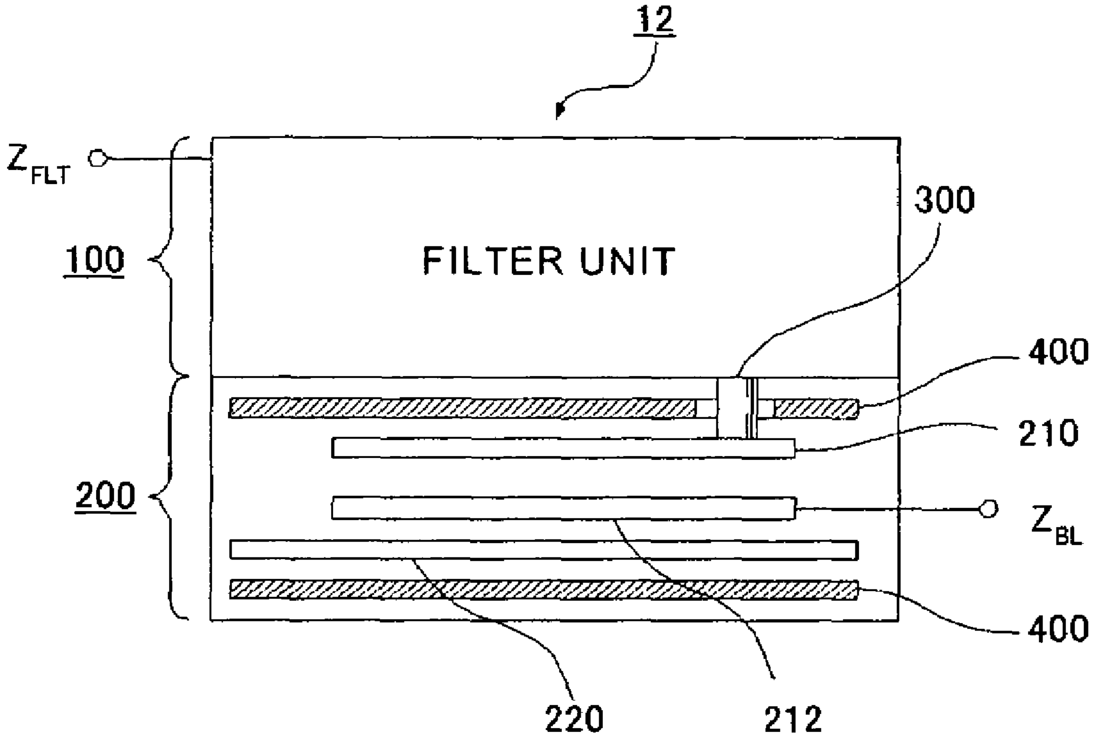
FIG. 4 is a sectional view illustrating a balance filter device according to a first embodiment of the present invention.

FIG. 4 is a sectional view illustrating a balance filter device 12 constructed in accordance with a first embodiment of the present invention. The balance filter device 12 shown in FIG. 4 is formed by integrating a balun unit 200 and a filter unit 100 together. The balun unit 200 and the filter unit 100 are each formed by laminating a plurality of dielectric substrates, and are connected to each other with a connecting portion 300 therebetween.

The filter unit 100 includes a λ/2 strip resonator, a λ/4 strip resonator, an LC resonator, etc., and the balun unit 200 is configured similarly to the structure shown in FIG. 1. The filter unit 100 is connected to the unbalanced resonance electrode 210 with the connecting portion 300 therebetween. The connecting portion 300 may be formed of a via-hole or a pattern. The filter unit 100 may be configured, as the structure disclosed in Japanese Unexamined Patent Application Publication No. 2002-111310.

The balance filter device 12 includes an external terminal Z<SUB>FLT</SUB>, which serves as the input/output port of the filter unit 100, and an external terminal Z<SUB>BL</SUB>, which serves as the input/output port of the balun unit 200. When integrating the balance filter device 12 into a wireless communication apparatus, branching filters, such as an RF switch (RF-SW) and a duplexer, are connected to the external terminal Z<SUB>FLT</SUB>, while an RF-IC is connected to the external terminal Z<SUB>BL</SUB>.

Figure 5:
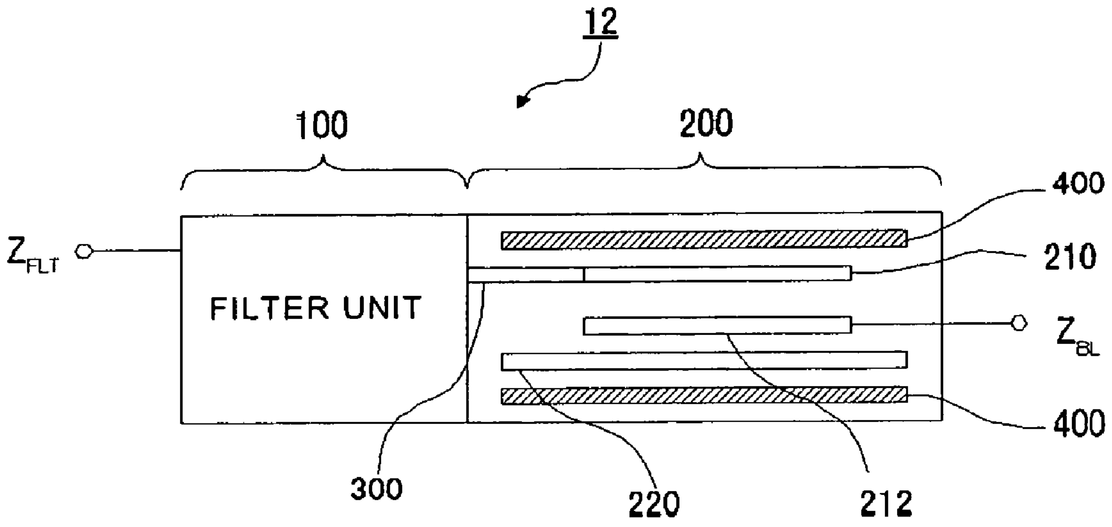
FIG. 5 is a sectional view illustrating a balance filter device according to a second embodiment of the present invention.

FIG. 5 is a sectional view illustrating a balance filter device constructed in accordance with a second embodiment of the present invention. The balance filter device 12 shown in FIG. 5 is configured such that the filter unit 100 and the balun unit 200 are disposed side by side with the connecting portion 300, which is a pattern, therebetween. The other features of the balance filter device 12 shown in FIG. 5 is similar to those of the balance filter device 12 shown in FIG. 4. It is desirable, as shown in FIG. 5, that the connecting portion 300 is extended from the unbalanced resonance electrode 210, thereby eliminating the need to provide an extra layer for the connecting portion 300.

Figure 6:
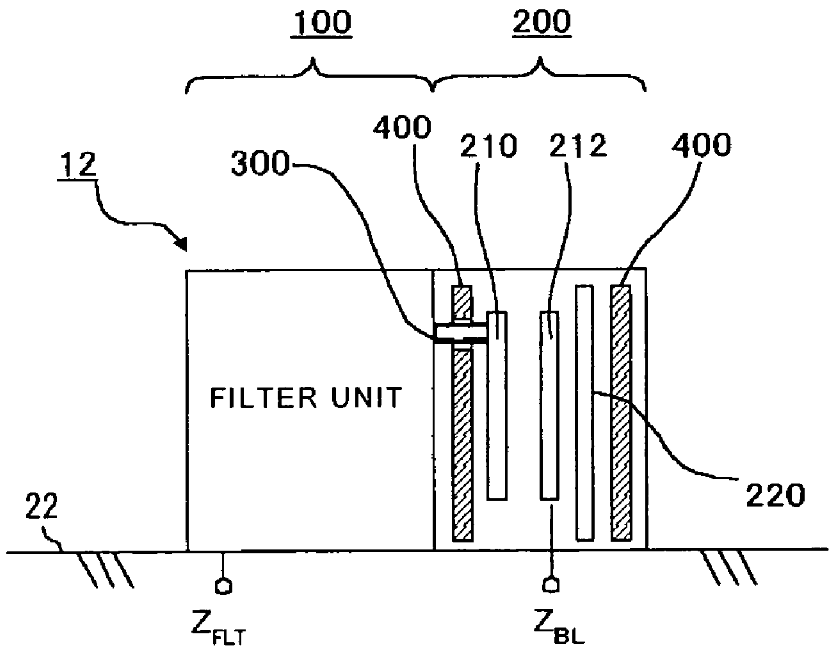
FIG. 6 is a sectional view illustrating a balance filter device according to a third embodiment of the present invention.

FIG. 6 is a sectional view illustrating a balance filter device constructed in accordance with a third embodiment of the present invention. In the balance filter device 12 shown in FIG. 6, various electrodes forming the balun unit 200 are disposed perpendicularly to a mounting face 22, in other words, dielectric substrates forming the balun unit 200 are laminated in parallel with the mounting face 22. With this configuration, the external terminals Z<SUB>FLT</SUB> and Z<SUB>BL</SUB> of the balance filter device 12 are extended toward the mounting face 22 and project from the bottom surface of the balance filter device 12. The other features of the configuration of the balance filter unit 12 shown in FIG. 6 are similar to those of the balance filter unit 12 shown in FIG. 4.

Figure 7:
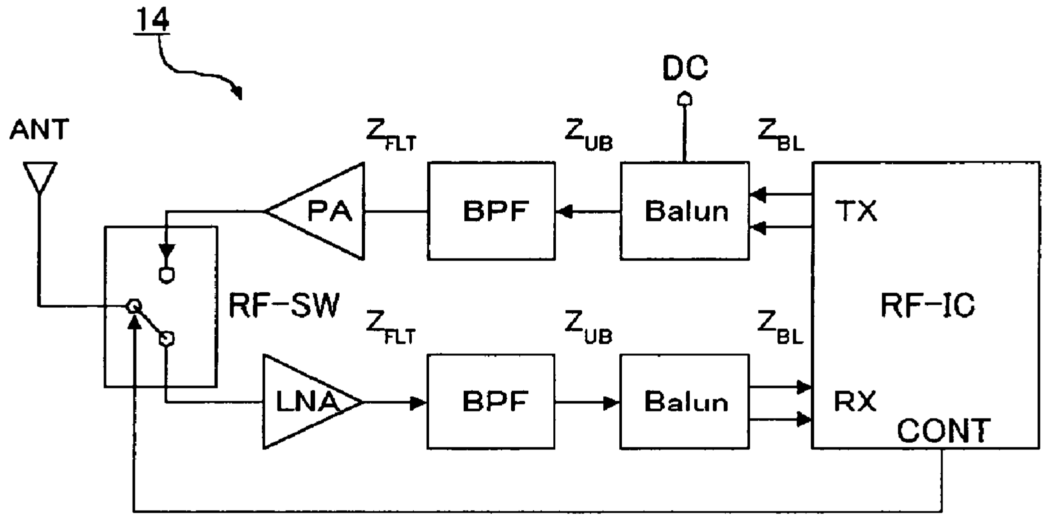
FIG. 7 is a circuit block diagram illustrating the configuration of an RF front end portion built into a wireless communication apparatus according to an embodiment of the present invention.

FIG. 7 is a circuit block diagram illustrating an RF front end portion integrated into the wireless communication apparatus according to an embodiment of the present invention. In a wireless communication circuit 14 shown in FIG. 7, a balun device is integrated into each of the transmission path TX and the reception path RX, and DC power is supplied to the balun device provided in the transmission path TX.

The wireless communication circuit 14 includes an antenna ANT for transmitting and receiving radio waves, an RF switch RF-SW for switching between the transmission path TX and the reception path RX, a power amplifier PA for amplifying signals in the transmission path TX, a low noise amplifier LNA for amplifying signals in the reception path RX, a bandpass filter BPF and a balun device Balun each disposed in the transmission path TX and the reception path RX, and an integrated circuit RF-IC for generating and processing RF signals. The transmission path TX and the reception path RX are switched by a signal output from a control port CONT of the integrated circuit RF-IC.

A signal received by the antenna ANT passes through the RF switch RF-SW, the low noise amplifier LNA, and the bandpass filter BPF, and is input into the reception balun device Balun as an unbalanced signal based on the GND potential. This unbalanced signal is converted into a balanced signal having a 180° phase difference and is input into the reception port RX of the integrated circuit RF-IC.

Meanwhile, a transmission signal generated by the integrated circuit RF-IC is input into the transmission balun device Balun from the transmission port TX as a balanced signal. The balanced signal is then converted into an unbalanced signal by the balun device while a DC bias is being applied to the balanced terminal. The unbalanced signal then passes through the bandpass filter BPF, the power amplifier PA, and the RF switch RF-SW, and is transmitted from the antenna ANT.

The balun devices Balun integrated into the wireless communication circuit 14 may be configured, as shown in FIG. 1, 2, or 3, and the bandpass filters BPF and the balun devices Balun may be integrated together into the balance filter device as shown in FIG. 4, 5, or 6. In the balun device Balun for receiving the DC signal, the intermediate electrode 200 shown in FIG. 1 preferably serves as an element for supplying DC power.

The input/output terminal Z<SUB>FLT</SUB> of the filter unit discussed with reference to FIGS. 4 through 6 and the unbalanced terminal Z<SUB>UB</SUB> and the balanced terminal Z<SUB>BL</SUB> of the balun device discussed with reference to FIGS. 1 through 6 are disposed at the positions indicated by the similar signs in FIG. 7.

In the example shown in FIG. 7, the DC signal is supplied to the balun device provided in the transmission path TX. However, the DC signal may be supplied to the reception path RX, or a DC signal may be supplied to neither the transmission path TX nor the reception path RX according to the specification of the wireless communication circuit 14.

Figure 8:
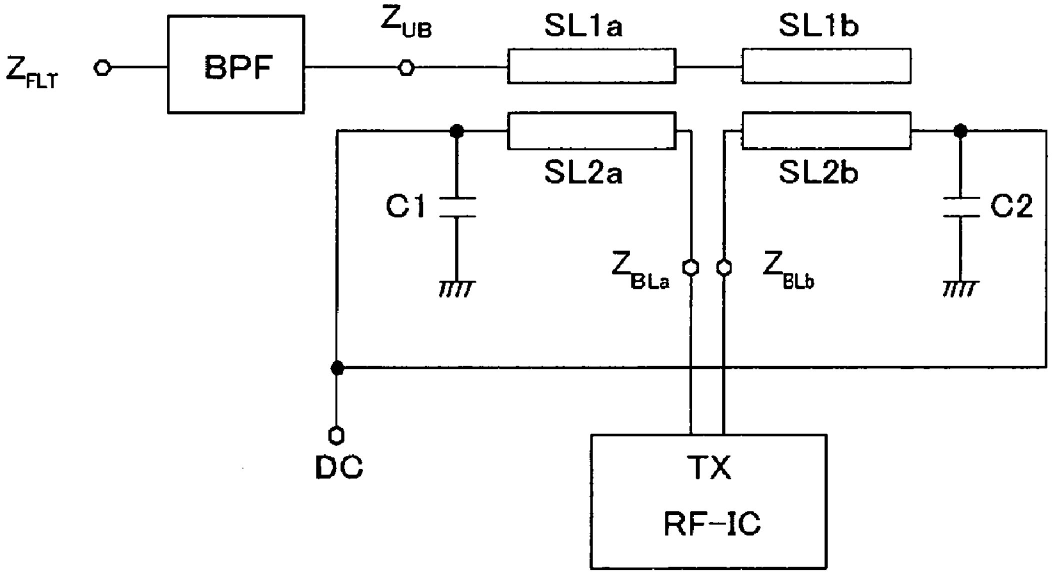
FIG. 8 is a circuit block diagram illustrating an equivalent circuit of a transmission balun device Balun shown in FIG. 7.

FIG. 8 is a circuit block diagram illustrating an equivalent circuit of the transmission balun device Balun shown in FIG. 7. The transmission balun device Balun to which the DC signal is supplied includes stripline resonators SL1*a* and SL1*b* forming unbalanced resonance electrodes, stripline resonators SL2*a* and SL2*b* forming balanced resonance electrodes, and AC-signal bypassing capacitors C1 and C2. The balun device Balun is connected to the bandpass filter BPF via the unbalanced terminal Z<SUB>UB</SUB>, and is connected to the integrated circuit RF-IC via the balanced terminals Z<SUB>BLa</SUB> and Z<SUB>BLb</SUB>. The AC-signal bypassing capacitors C1 and C2 are formed by capacitive coupling generated between the intermediate electrode 220 and the GND electrode 400-2 shown in FIG. 1.

Figure 9:
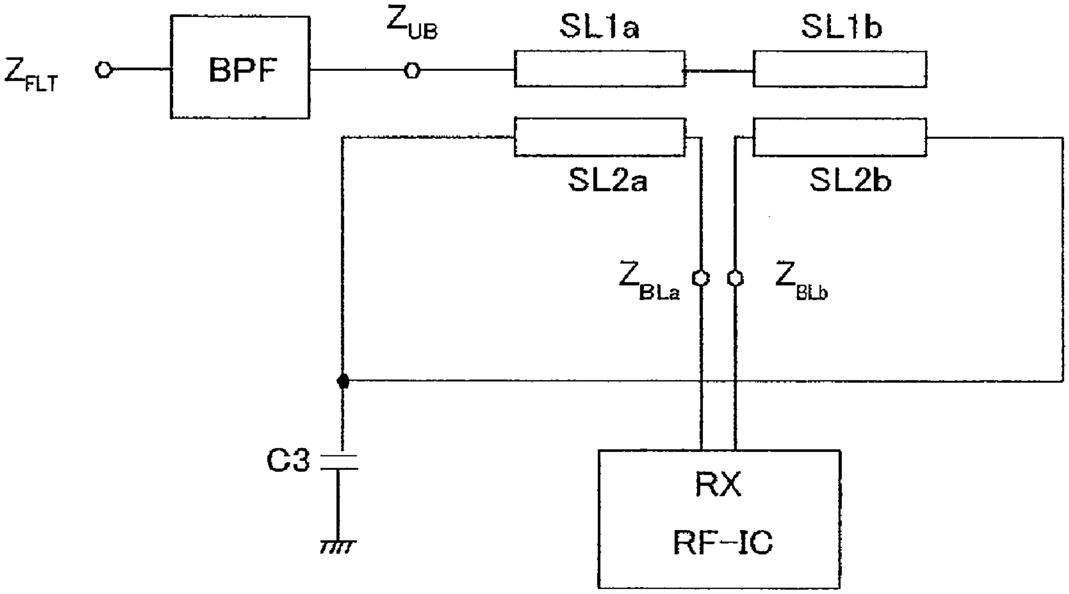
FIG. 9 is a circuit block diagram illustrating an equivalent circuit of a reception balun device Balun shown in FIG. 7.

FIG. 9 is a circuit block diagram illustrating an equivalent circuit of the reception balun device Balun shown in FIG. 7. The reception balun device Balun is configured similarly to the transmission balun device Balun shown in FIG. 8, except that the DC terminal is not provided and a capacitor C3 for adjusting the characteristic of the balun device Balun is provided instead of the AC-signal bypassing capacitors C1 and C2. The capacitor C3 is formed by capacitive coupling generated between the intermediate electrode 220 and the GND electrode 400-2 shown in FIG. 1.

Figure 10:
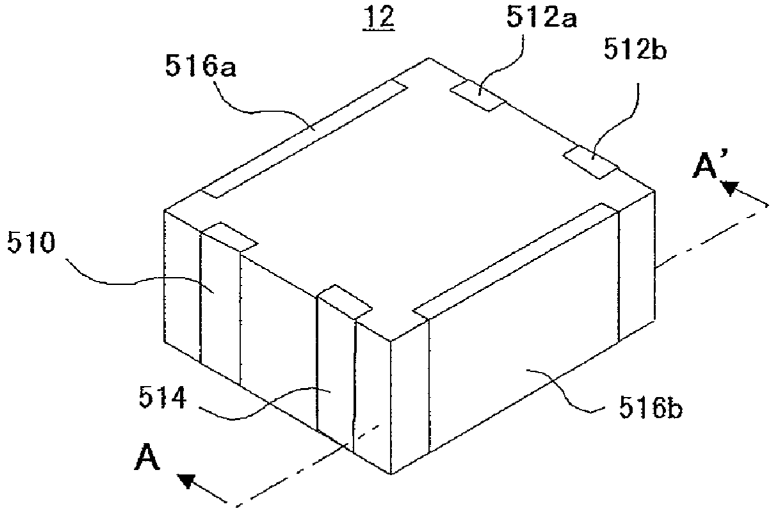
FIG. 10 is a perspective view illustrating an external structure of a balance filter device according to an embodiment of the present invention.

FIG. 10 is a perspective view illustrating the external structure of the balance filter device 12 according to an embodiment of the present invention. The balance filter device 12 has a structure, as shown in FIG. 10, in which the bandpass filters BPF and the balun devices Balun shown in FIG. 7 are integrated together. The balance filter device 12 has an unbalanced terminal 510, balanced terminals 512*a* and 512*b*, a DC terminal 514, and GND terminals 516*a* and 516*b*.

Figure 11:
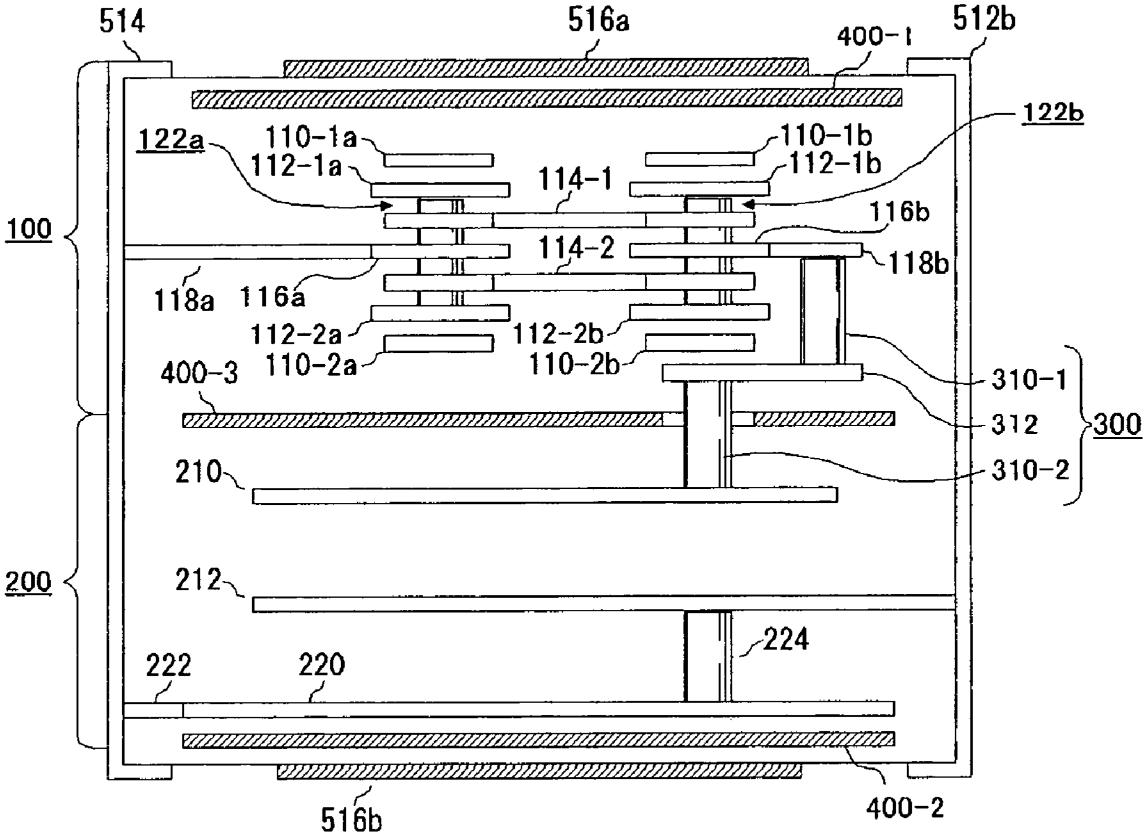
FIG. 11 is a sectional view taken along line A-A' illustrating the balance filter device shown in FIG. 10.

FIG. 11 is a sectional view taken along line A-A' of the balance filter device 12 shown in FIG. 10. The balance filter device 12 is formed of the filter unit 100 and the balun unit 200 integrated into each other in the laminating direction, and a GND electrode 400-3 intervening between the filter unit 100 and the balun unit 200 serves as a layer for preventing the interference between the two units.

In the filter unit 100, resonance electrodes 116*a* and 116*b* are disposed between the GND electrodes 400-1 and 400-3 so as to form a strip resonance structure. Coupling electrodes 114-1 and 114-2 for adjusting the degree of coupling between the resonance electrodes 116*a* and 116*b* are disposed such that they sandwich the resonance electrodes 116*a* and 116*b* therebetween in parallel with the laminating direction.

At the outer portions of the coupling electrodes 114-1 and 114-2, turnover resonance electrodes 112-1*a*, 112-1*b*, 112-2*a*, and 112-2*b* formed by turning over the free ends of the resonance electrodes 116*a* and 116*b* are provided, and the resonance electrodes 116*a* and 116*b* and the turnover resonance electrodes 112-1*a*, 112-1*b*, 112-2*a*, and 112-2*b* are connected to each other by resonator turning-over via-holes 122*a* and 122*b*.

At the outer portions of the turnover resonance electrodes 112-1*a*, 112-1*b*, 112-2*a*, and 112-2*b*, wavelength shortening electrodes 110-1*a*, 110-1*b*, 110-2*a*, and 110-2*b* connected to a GND electrode 516*a* are disposed such that they face the turnover resonance electrodes 112-1*a*, 112-1*b*, 112-2*a*, and 112-2*b*, respectively.

The resonance electrode 116*a* is connected to the unbalanced terminal 510 shown in FIG. 10 with a filter input/output electrode 118*a* therebetween, while the resonance electrode 116*b* is connected to the unbalanced resonance electrode 210 of the balun unit 200 with a filter input/output electrode 118*b* and the connecting portion 300 therebetween.

The connecting portion 300 includes a connecting via-hole 310-1, a connecting pattern 312, and a connecting via-hole 310-2, and the filter unit 100 and the balun unit 200 are connected to each other by the connecting portion 300 arranged as shown in FIG. 11. In this case, the GND electrode 400-3 is provided with a through-hole for allowing the connecting via-hole 310-2 to pass therethrough.

In the balun unit 200, the unbalanced resonance electrode 210 and the balanced resonance electrode 212 facing each other are disposed between the GND electrodes 400-3 and 400-2 so as to form a strip resonance structure. The intermediate electrode 220 is disposed between the balanced resonance electrode 212 and the GND electrode 400-2.

The intermediate electrode 220 is connected to the DC terminal 514 shown in FIG. 10 with an input/output electrode 222 therebetween, and is connected to the balanced terminal resonance electrode 212 with a connecting via-hole 224 therebetween. The intermediate electrode 220 serves as a DC supply layer with capacitive coupling generated between the balanced terminal resonance electrode 212 and the GND electrode 400-2. It is desirable, as shown in FIG. 11, that the intermediate electrode 220 is disposed closer to the GND electrode 400-2 than the balanced terminal resonance electrode 212.

The balanced terminal resonance electrode 212 is connected to the balanced terminals 512*a* and 512*b* shown in FIG. 10, and the GND electrodes 400-1, 400-2, and 400-3 are connected to the GND terminals 516*a* and 516*b* shown in FIG. 10.

Figure 12:
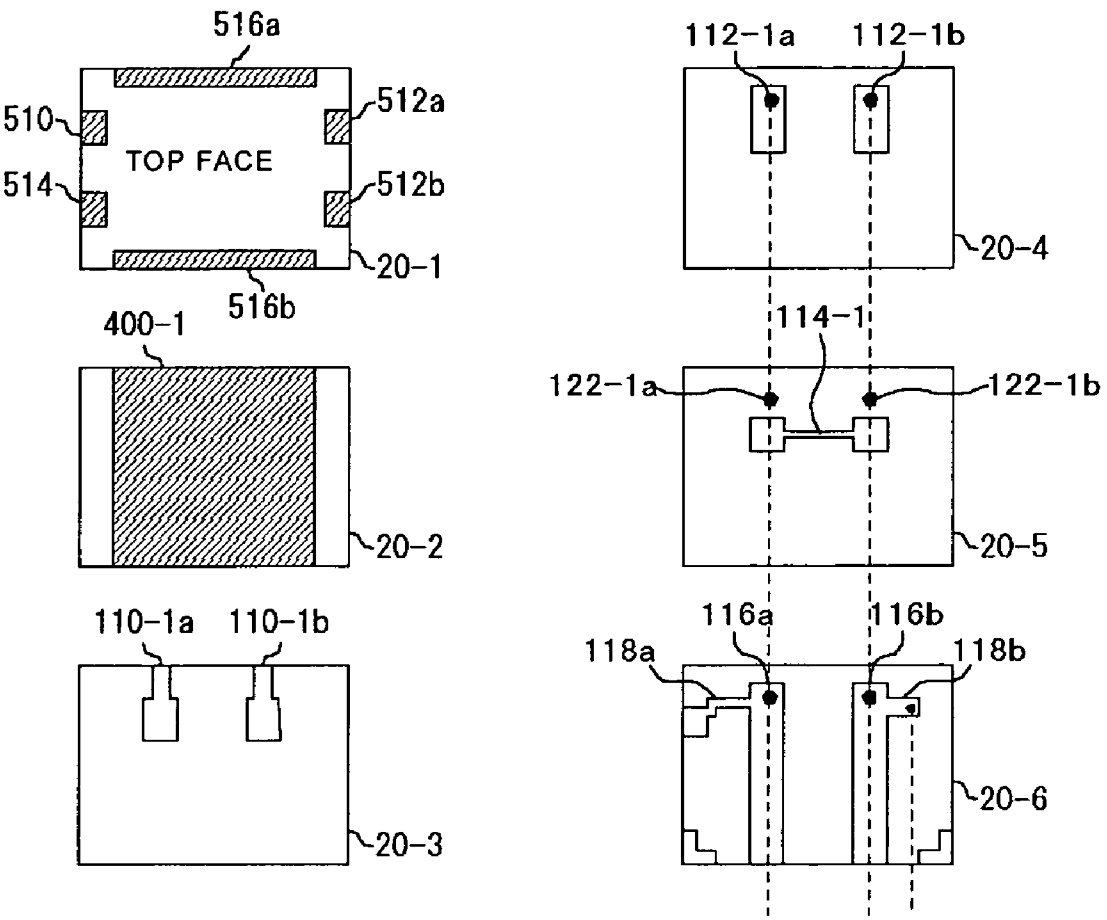
FIG. 12 is a first plan view illustrating the structures of various electrodes forming the balance filter device shown in FIG. 10.

FIG. 12 is a first plan view illustrating the structures of various electrodes forming the balance filter device 12 shown in FIG. 10. The balance filter device 12 is formed of, as shown in FIG. 10, by laminating a plurality of dielectric substrates on which various electrode patterns are formed. It is preferable that the dielectric substrates are formed of the same material, in particular, in order to reduce the size of the balance filter device 12, it is preferable that the dielectric substrates are formed of a material having a high dielectric constant $\in$. The characteristics of the electrodes formed on the dielectric substrates are discussed below in the order from the topmost layer to the bottommost layer.

A dielectric layer 20-1 serves as the topmost layer (top face) of the balance filter device 12 shown in FIG. 10, and the external terminals 510, 512*a*, 512*b*, 514, 516*a*, and 516*b* are disposed on the surface of the dielectric layer 20-1 as the external electrodes, as in the arrangement shown in FIG. 12.

The GND electrode 400-1 is disposed on a dielectric layer 20-2 with the configuration shown in FIG. 12. The wavelength shortening electrode 110-1*a* and 110-1*b* are disposed on a dielectric layer 20-3. The turnover resonance electrodes 112-1*a* and 112-1*b* are formed on a dielectric layer 20-4. The coupling electrodes 114-1 and the resonator turning-over via-holes 122-1*a* and 122-1*b* are formed on a dielectric layer 20-5. The resonance electrodes 116*a* and 116*b* and the filter input/output electrodes 118*a* and 118*b* are disposed on a dielectric layer 20-6.

The top and bottom ends of the GND electrode 400-1 formed on the dielectric layer 20-2 are connected to the GND terminals 516*a* and 516*b* shown in FIG. 10. The top ends of the wavelength shortening electrodes 110-1*a* and 110-1*b* formed on the dielectric layer 20-3 are connected to the GND terminals 516*a* and 516*b* shown in FIG. 10. The bottom ends of the resonance electrodes 116*a* and 116*b* disposed on the dielectric layer 20-6 are connected to the GND terminals 516*a* and 516*b* shown in FIG. 10.

The turnover resonance electrodes 112-1*a* and 112-1*b* formed on the dielectric layer 20-4 are connected to the free ends of the resonance electrodes 116*a* and 116*b* formed on the dielectric layer 20-6 with the connecting via-holes therebetween, and the resonance electrode 116*a* is connected to the unbalanced terminal 510 shown in FIG. 10 with the filter input/output electrode 118*a* therebetween.

The path of the via-holes for connecting the individual layers is indicated by the broken lines in FIG. 12, and the connecting points of the via-holes are indicated by the black dots. The path of the via-holes may be changed by using a plurality of dielectric layers (not shown) so that the lengths of the via-holes can be adjusted.

Figure 13:
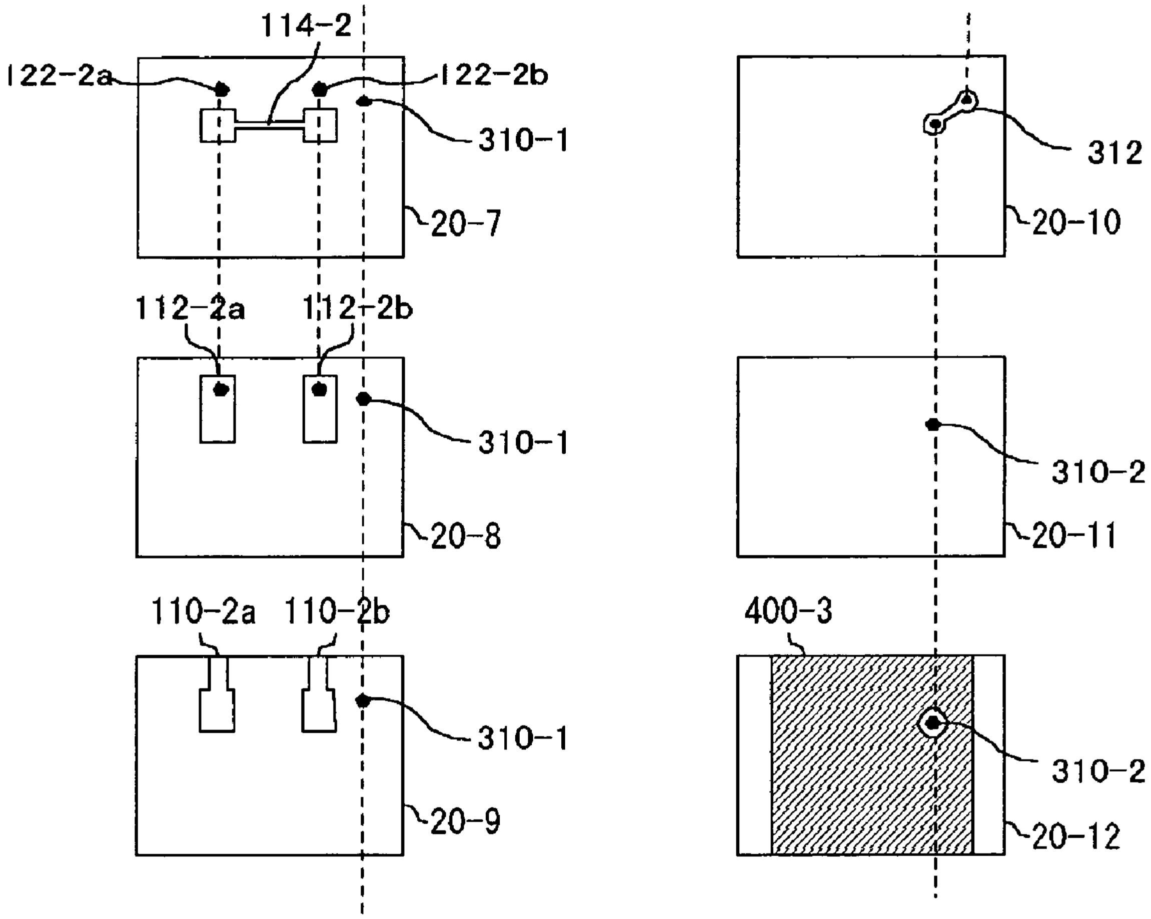
FIG. 13 is a second plan view illustrating the structures of various electrodes forming the balance filter device shown in FIG. 10.

FIG. 13 is a second plan view illustrating the structures of various electrodes forming the balance filter device 12 shown in FIG. 10. The coupling electrode 114-2 is formed on a dielectric layer 20-7. The turnover resonance electrodes 112-2*a* and 112-2*b* are formed on a dielectric layer 20-8. The wavelength shortening electrodes 110-2*a* and 110-2*b* are disposed on a dielectric layer 20-9. The connecting pattern 312 is disposed on a dielectric layer 20-10. The connecting via-hole 310-2 is formed on a dielectric layer 20-11. The GND electrode 400-3 is disposed on a dielectric layer 20-12.

The top ends of the wavelength shortening electrodes 110-2*a* and 110-2*b* disposed on the dielectric layer 20-9 are connected to the GND terminals 516*a* and 516*b* shown in FIG. 10. The top and bottom ends of the GND electrode 400-3 formed on the dielectric layer 20-12 are connected to the GND terminals 516*a* and 516*b* shown in FIG. 10. The GND electrode 400-3 is provided with a through-hole to allow the connecting via-hole 310-2 to pass therethrough.

The coupling electrode 114-2 and the turnover resonance electrodes 112-2*a* and 112-2*b* formed on the dielectric layers 20-7 and 20-8, respectively, are connected to the resonance electrodes 116*a* and 116*b* disposed on the dielectric layer 20-6 shown in FIG. 12 with the resonator turning-over via-holes 122-2*a* and 122-2*b* therebetween formed on the dielectric layer 20-7.

The connecting pattern 312 formed on the dielectric layer 20-10 is connected to the filter input/output electrode 118*b* disposed on the dielectric layer 20-6 shown in FIG. 12 with the connecting via-hole 310-1 therebetween.

Figure 14:
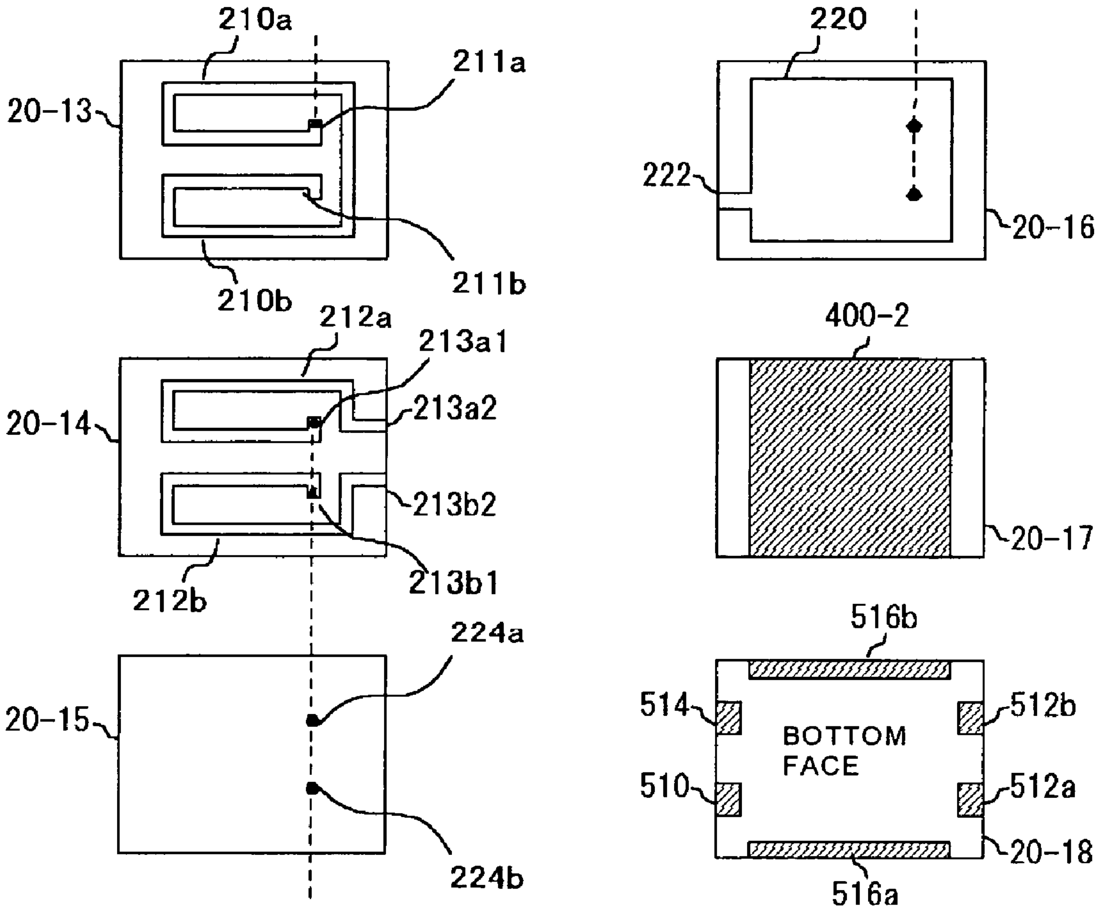
FIG. 14 is a third plan view illustrating the structures of various electrodes forming the balance filter device shown in FIG. 10.

FIG. 14 is a third plan view illustrating the structures of various electrodes forming the balance filter device 12 shown in FIG. 10. The unbalanced resonance electrodes 210*a* and 210*b* are formed on a dielectric layer 20-13. The balanced resonance electrodes 212*a* and 212*b* are formed on a dielectric layer 20-14. The connecting via-holes 224*a* and 224*b* are formed on a dielectric layer 20-15. The intermediate electrode 220 and the input/output electrode 222 are disposed on a dielectric layer 20-16. The GND electrode 400-2 is disposed on a dielectric layer 20-17. The external terminals 510, 512*a*, 512*b*, 514, 516*a*, and 516*b* are formed on a dielectric layer 20-18 as the external electrodes. The dielectric layer 20-18 shown in FIG. 14 indicates the bottom face of the balance filter device 12 shown in FIG. 10.

The unbalanced resonance electrodes 210*a* and 210*b* formed on the dielectric layer 20-13 are connected at the end 211*a* to the connecting pattern 312 formed on the dielectric layer 20-10 shown in FIG. 13 with the connecting via-hole 310-2 therebetween.

The balanced resonance electrodes 212*a* and 212*b* disposed on the dielectric layer 20-14 are respectively connected at their first ends 213*a*1 and 213*b*1 to the intermediate layer 220 formed on the dielectric layer 20-16 with the connecting via-holes 224*a* and 224*b* therebetween. The balanced resonance electrodes 212*a* and 212*b* are also respectively connected at their second ends 213*a*2 and 213*b*2 to the balanced terminals 512*a* and 512*b* shown in FIG. 10.

The intermediate electrode 220 disposed on the dielectric layer 20-16 is connected to the DC terminal 514 shown in FIG. 10 with the input/output electrode 222 therebetween. The top and bottom ends of the GND electrode 400-2 formed on the dielectric layer 20-17 are connected to the GND terminals 516*a* and 516*b* shown in FIG. 10.

Figure 15:
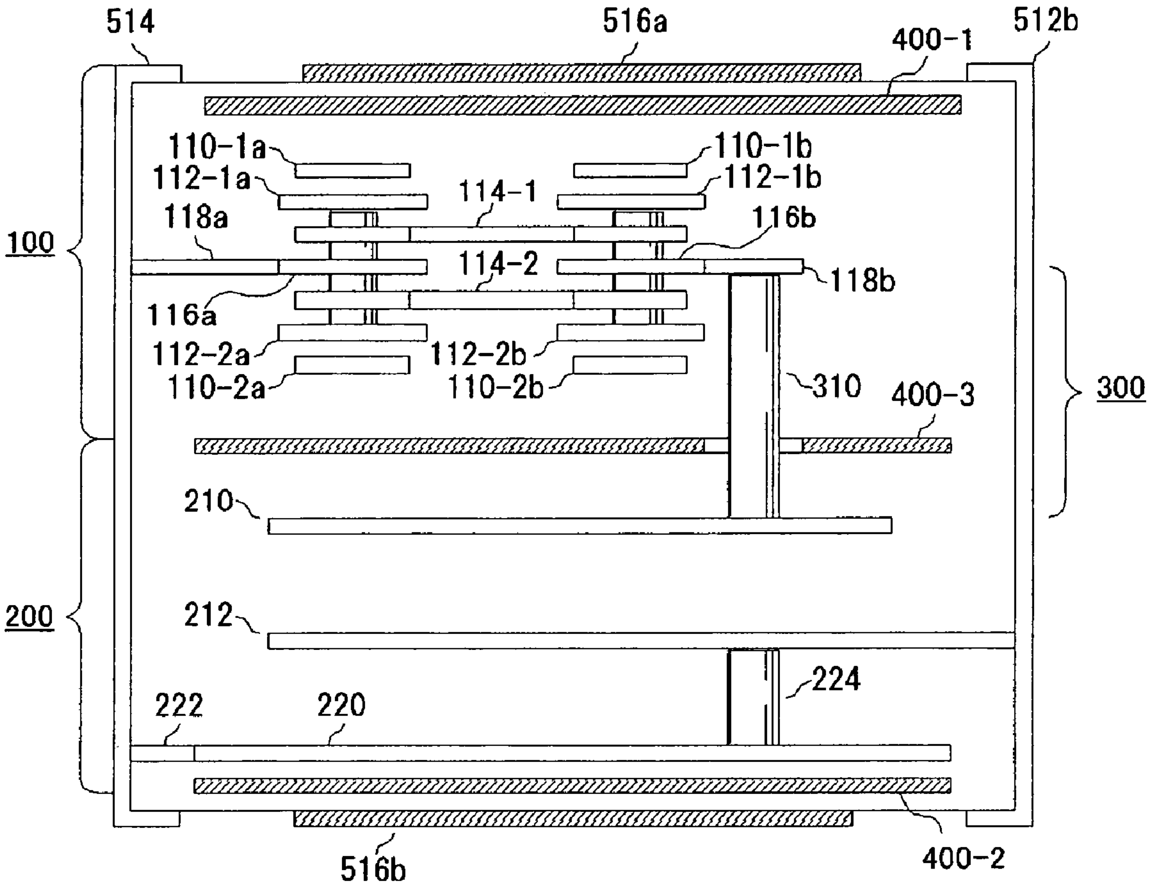
FIG. 15 is a sectional view taken along line A-A' illustrating a first modified example of the balance filter device shown in FIG. 10.

FIG. 15 is a sectional view taken along line A-A' illustrating a first modified example of the balance filter device 12 shown in FIG. 10. This balance filter device 12 is different from that shown in FIG. 11 in that the resonance electrodes 116*a* and 116*b* forming the filter unit 100 are displaced toward the unbalanced terminal 510 without the connecting pattern 312. With this configuration, the connecting portion 300 is formed of only the connecting via-hole 310, and the filter input/output electrode 118*b* and the unbalanced resonance electrode 210 are connected to each other with the connecting via-hole 310 therebetween. The other features of the configuration of the balance filter device 12 shown in FIG. 15 are similar to those shown in FIG. 11.

Figure 16:
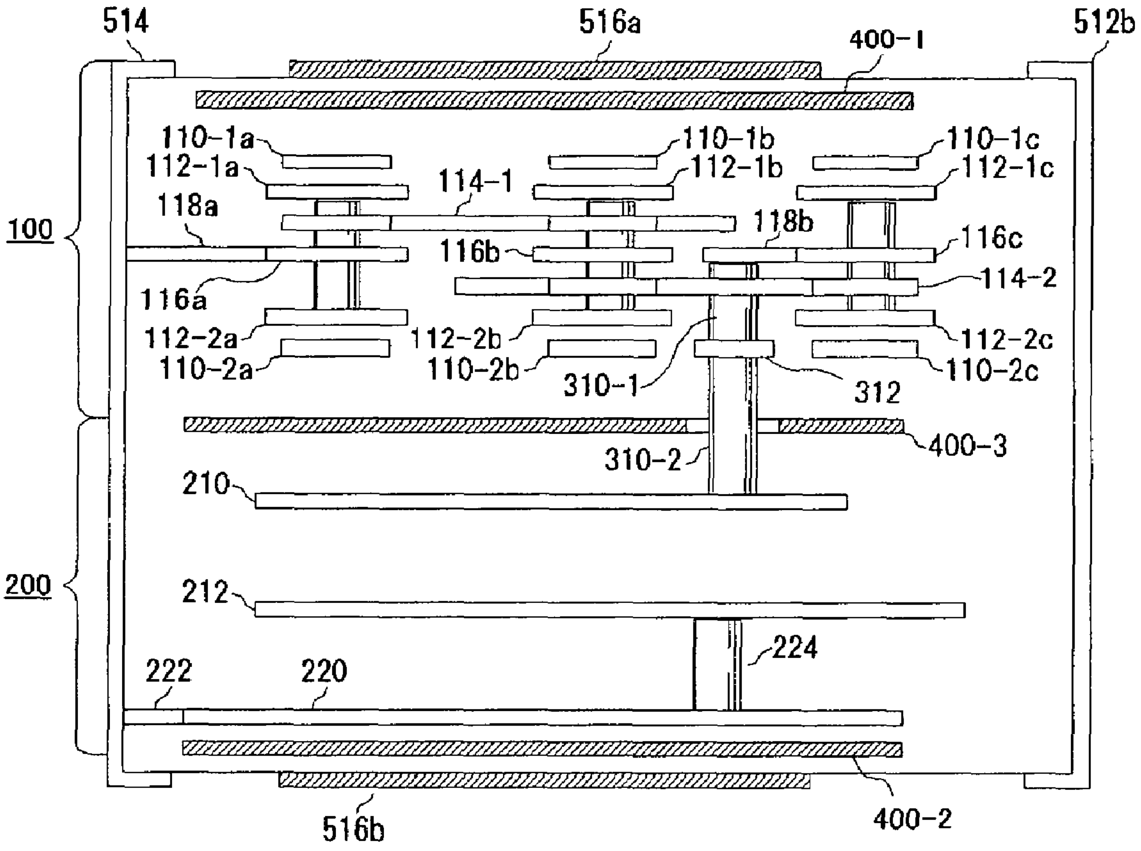
FIG. 16 is a sectional view taken along line A-A' illustrating a second modified example of the balance filter device shown in FIG. 10.

FIG. 16 is a sectional view taken along line A-A' illustrating a second modified example of the balance filter device 12 shown in FIG. 10. In this balance filter device 12, the number of resonance electrodes is increased from two to three.

In this modified example, as shown in FIG. 16, three resonance electrodes 116*a*, 116*b*, and 116*c*, coupling electrodes 114-1 and 114-2 disposed above and below the resonance electrodes 116*a*, 116*b*, and 116*c*, turnover resonance electrodes 112-1*a*, 112-1*b*, 112-1*c*, 112-2*a*, 112-2*b*, and 112-2*c*, and wavelength shortening electrodes 110-1*a*, 110-1*b*, 110-1*c*, 110-2*a*, 110-2*b*, and 110-2*c* are provided. A connecting portion 300 is disposed between the resonance electrodes 116*b* and 116*c*. The other features of the configuration of the balance filter device 12 shown in FIG. 16 are similar to those shown in FIG. 11. The connecting portion

300 may be disposed between the resonance electrodes 116*a* and 116*b* or at the outer portion of the resonance electrode 116*a* or 116*c*.

Figure 17:
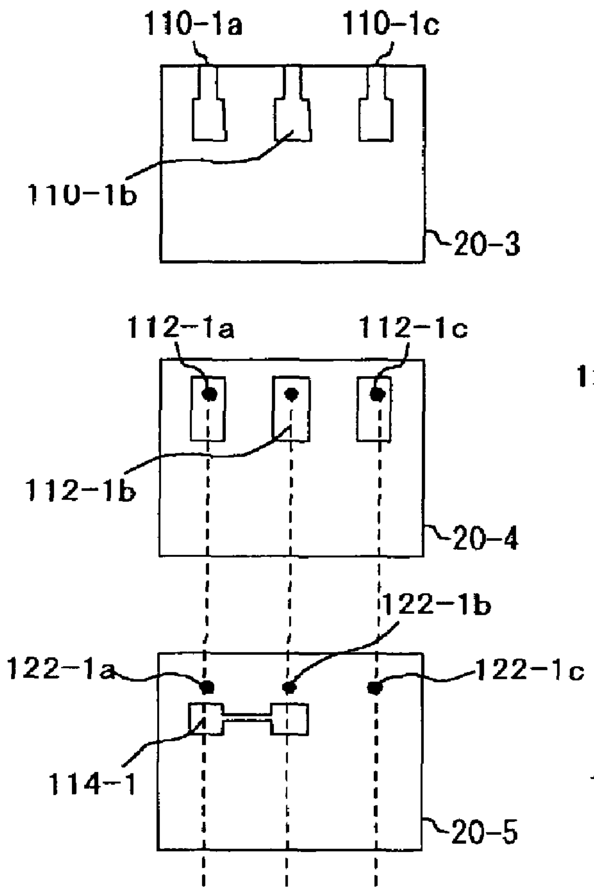
FIG. 17 is a first plan view illustrating the structures of various electrodes forming a balance filter device shown in FIG. 16.
Figure 18:
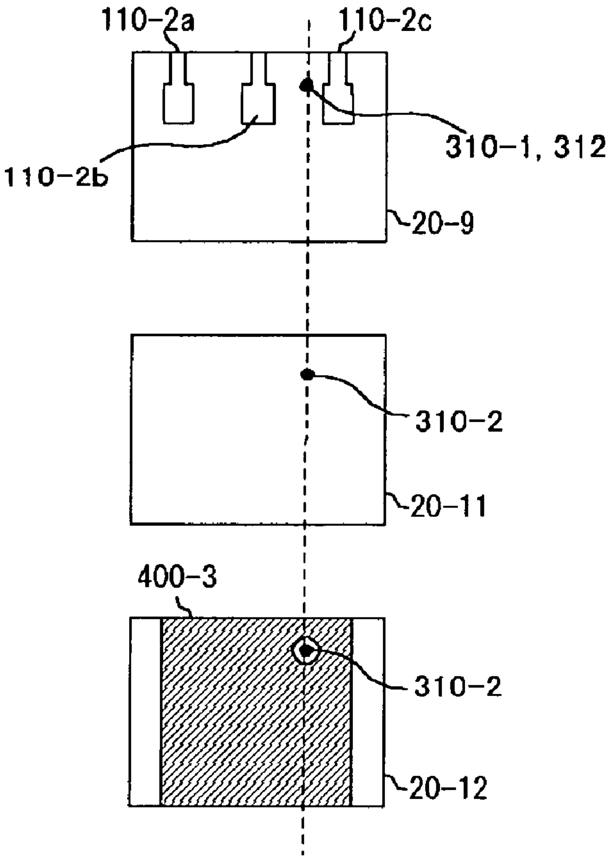
FIG. 18 is a second plan view illustrating the structures of various electrodes forming the balance filter device shown in FIG. 16.

FIGS. 17 and 18 are a first plan view and a second plan view, respectively, illustrating the structures of various electrodes forming the balance filter device 12 shown in FIG. 16. In FIGS. 17 and 18, the layers unique to the balance filter device 12 shown in FIG. 16 are extracted from the plan views shown in FIGS. 12 through 14.

To expand a double-pole balance filter device to a triple-pole balance filter device, as shown in FIGS. 17 and 18, three wavelength shortening electrodes are formed on each of the dielectric layers 20-3 and 20-9, three turnover resonance electrodes are formed on each of the dielectric layers 20-4 and 20-8, and three resonance electrodes are formed on the dielectric layer 20-6. The resonance electrodes 116*a* and 116*b* are coupled with each other by the coupling electrode 114-1 formed on the dielectric layer 20-5, while the resonance electrodes 116*b* and 116*c* are coupled with each other by the coupling electrode 114-2 formed on the dielectric layer 20-7. The resonance electrodes 116*a,* 116*b,* and 116*c* are connected to the turnover resonance electrodes 112-1*a,* 112-1*b,* 112-1*c,* 112-2*a,* 112-2*b,* and 112-2*c* by using three resonator turning-over via-holes 122-1*a,* 122-1*b,* and 122-1*c* formed on a dielectric layer 20-5.

The filter unit 100 and the balun unit 200 can be connected to each other with the connecting via-holes 310-1 and 310-2 therebetween by connecting the end of the filter input/output electrode 118*b* formed on the dielectric layer 20-6 to the end 211*a* of the unbalanced resonance electrode 211 formed on the dielectric layer 20-13. The other features of the configuration of the balance filter device 12 shown in FIGS. 17 and 18 are similar to those shown in FIGS. 12 through 14.

Figure 19:
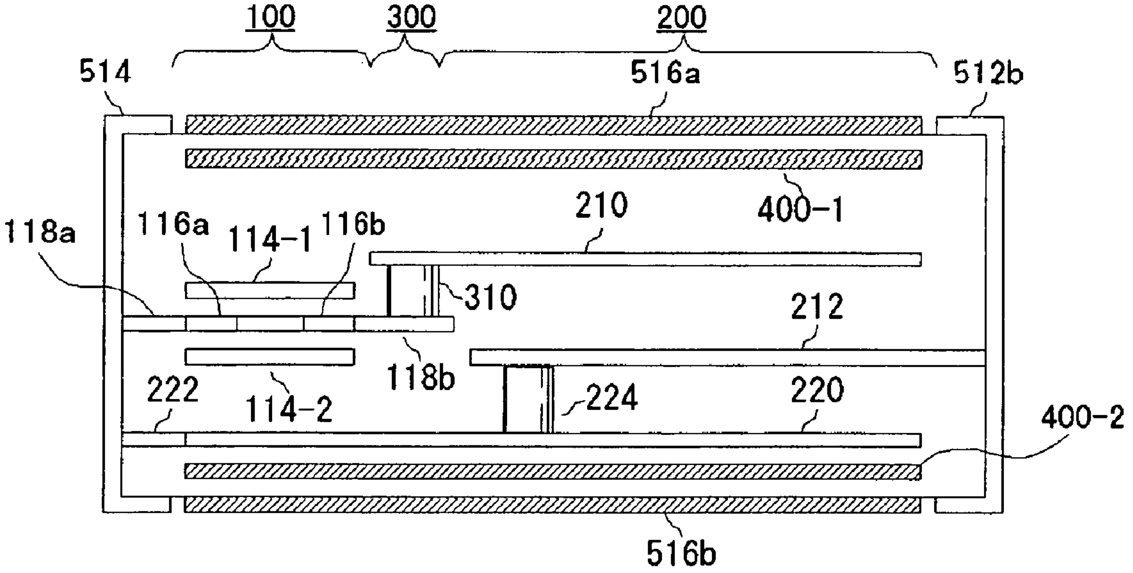
FIG. 19 is a sectional view taken along line A-A' illustrating a third modified example of the balance filter device shown in FIG. 10.

FIG. 19 is a sectional view taken along line A-A' illustrating a third modified example of the balance filter device 12 shown in FIG. 10. The balance filter device 12 shown in FIG. 19 has a structure in which the filter unit 100 and the balun unit 200 are disposed side by side.

With this structure, the filter unit 100 is disposed at the side of the unbalanced terminal 510, while the balun unit 200 is disposed at the side of the balanced terminal 512. The filter input/output electrode 118*b* and the unbalanced resonance electrode 210 of the balun unit 200 are connected to each other with the connecting via-hole 310 therebetween.

The GND electrodes 400-1 and 400-2 are used both for the filter unit 100 and the balun unit 200 so that they each form a strip resonance structure. The intermediate electrode 220 faces both the filter unit 100 and the balun unit 200. The other features of the configuration of the balance filter device 12 shown in FIG. 19 are similar to those shown in FIG. 11.

Figure 20:
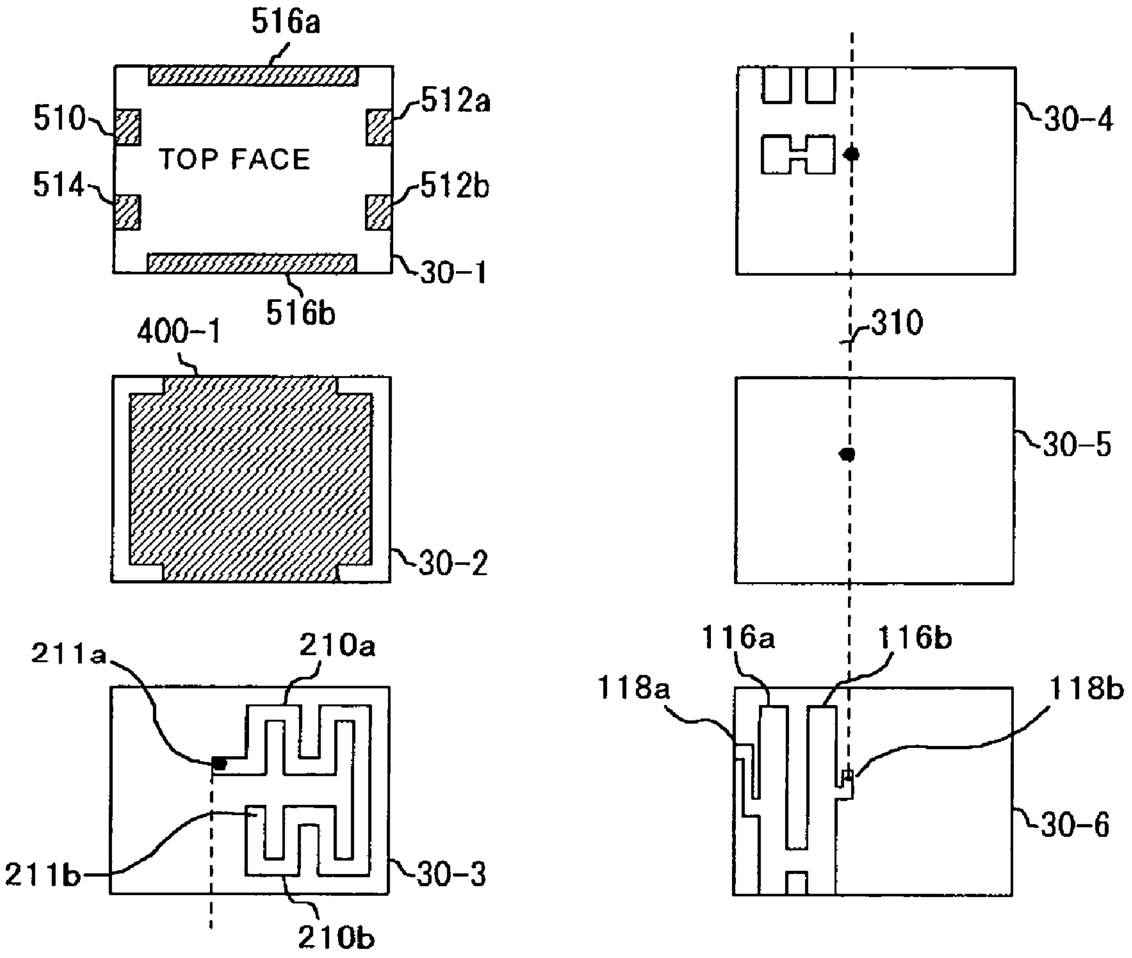
FIG. 20 is a first plan view illustrating the structures of various electrodes forming a balance filter device shown in FIG. 19.
Figure 21:
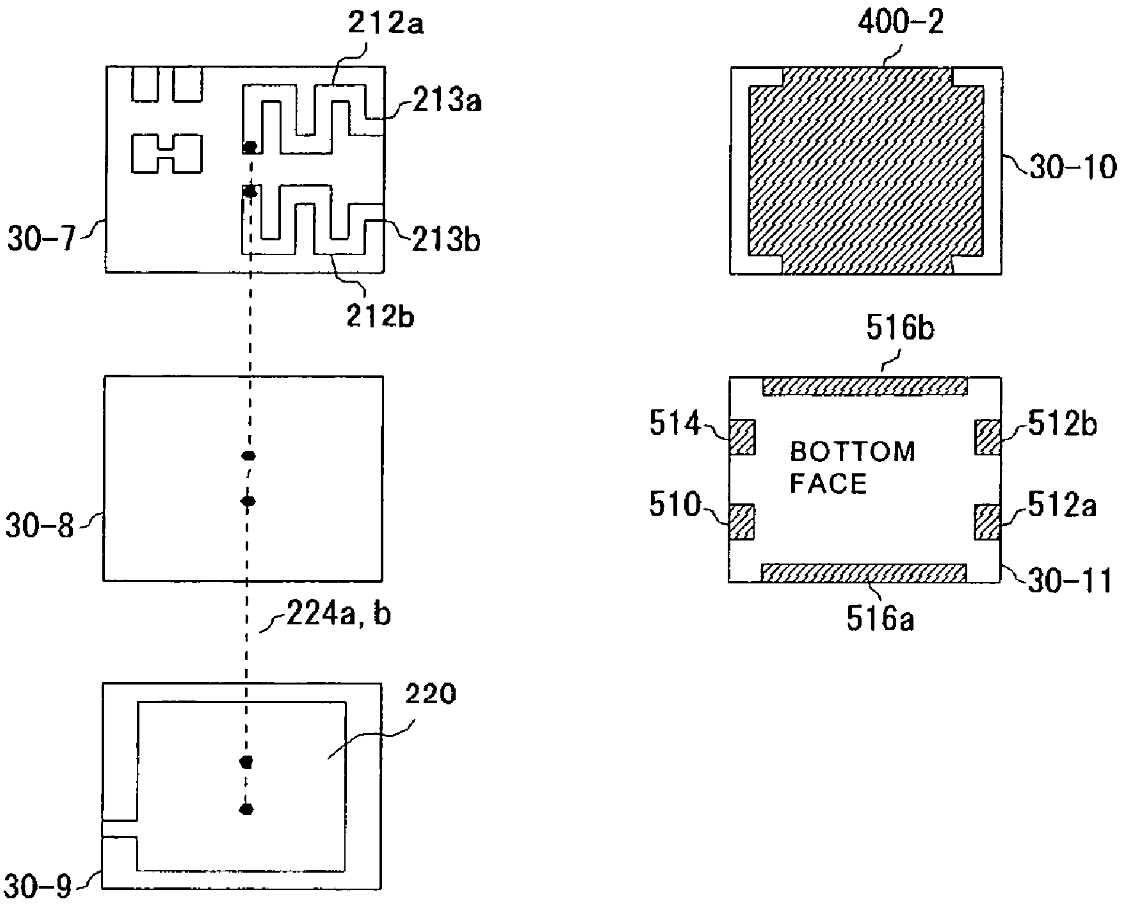
FIG. 21 is a second plan view illustrating the structures of various electrodes forming the balance filter device shown in FIG. 19.

FIGS. 20 and 21 are a first plan view and a second plan view, respectively, illustrating the structures of various electrodes forming the balance filter device 20 shown in FIG. 19. The basic layer structure shown in FIGS. 20 and 21 is similar to that shown in FIGS. 12 through 14. In this modified example, however, a dielectric layer 30-6 on which the resonance electrodes 116*a* and 116*b* of the filter unit 100 are formed is disposed between a dielectric layer 30-3 on which the unbalanced resonance electrodes 210*a* and 210*b* of the balun unit 200 are formed and a dielectric layer 30-7 on which the balanced resonance electrodes 212*a* and 212*b* are formed.

The end 211*a* of the unbalanced resonance electrodes 210*a* and 210*b* formed on the dielectric layer 30-3 is connected to the filter input/output electrode 118*b* formed on the dielectric layer 30-6 with the connecting via-hole 310 therebetween. The ends opposite to the ends 213*a* and 213*b* of the balanced resonance electrodes 212*a* and 212*b,* respectively, formed on the dielectric layer 30-7 are connected to the intermediate electrode 220 formed on a dielectric layer 30-9 with the connecting via-holes 224*a* and 224*b,* respectively, therebetween.

Figure 22:
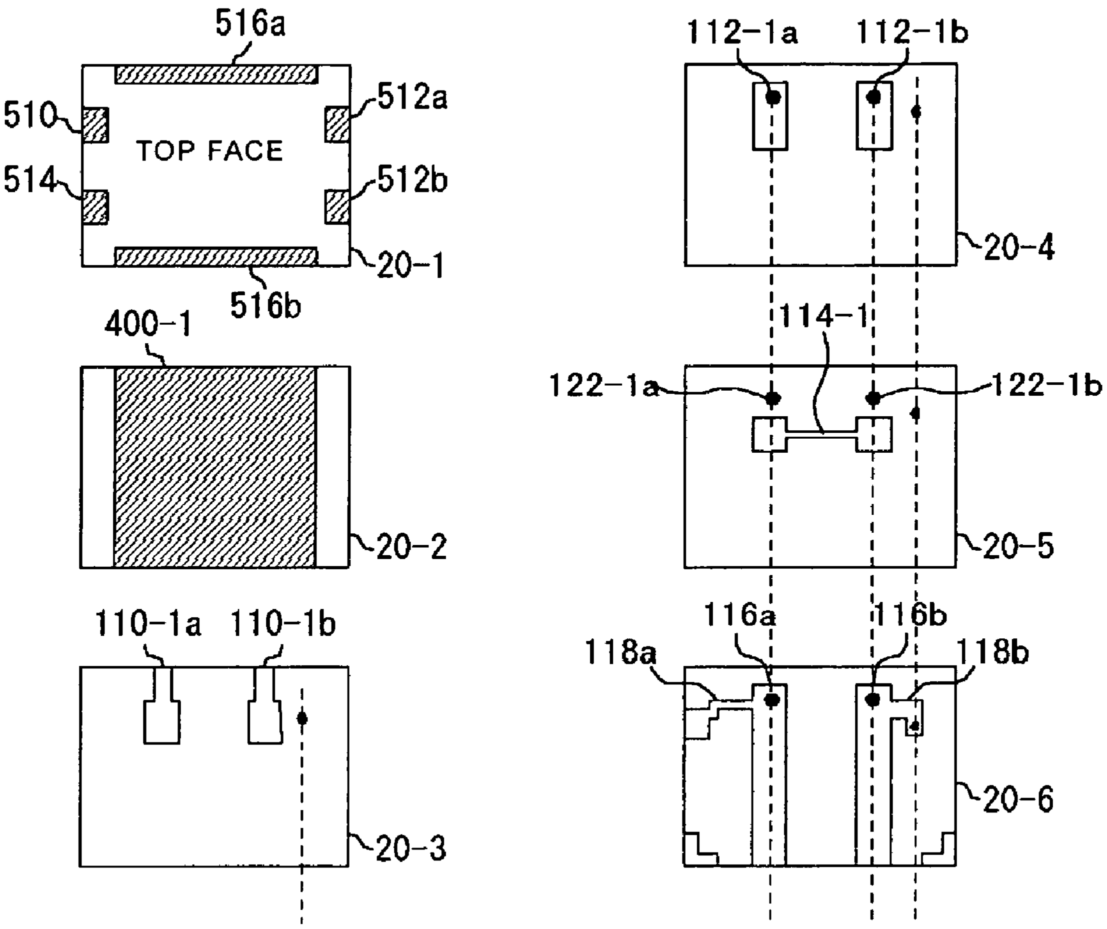
FIG. 22 is a plan view illustrating a modified example of the structure shown in FIG. 12.
Figure 23:
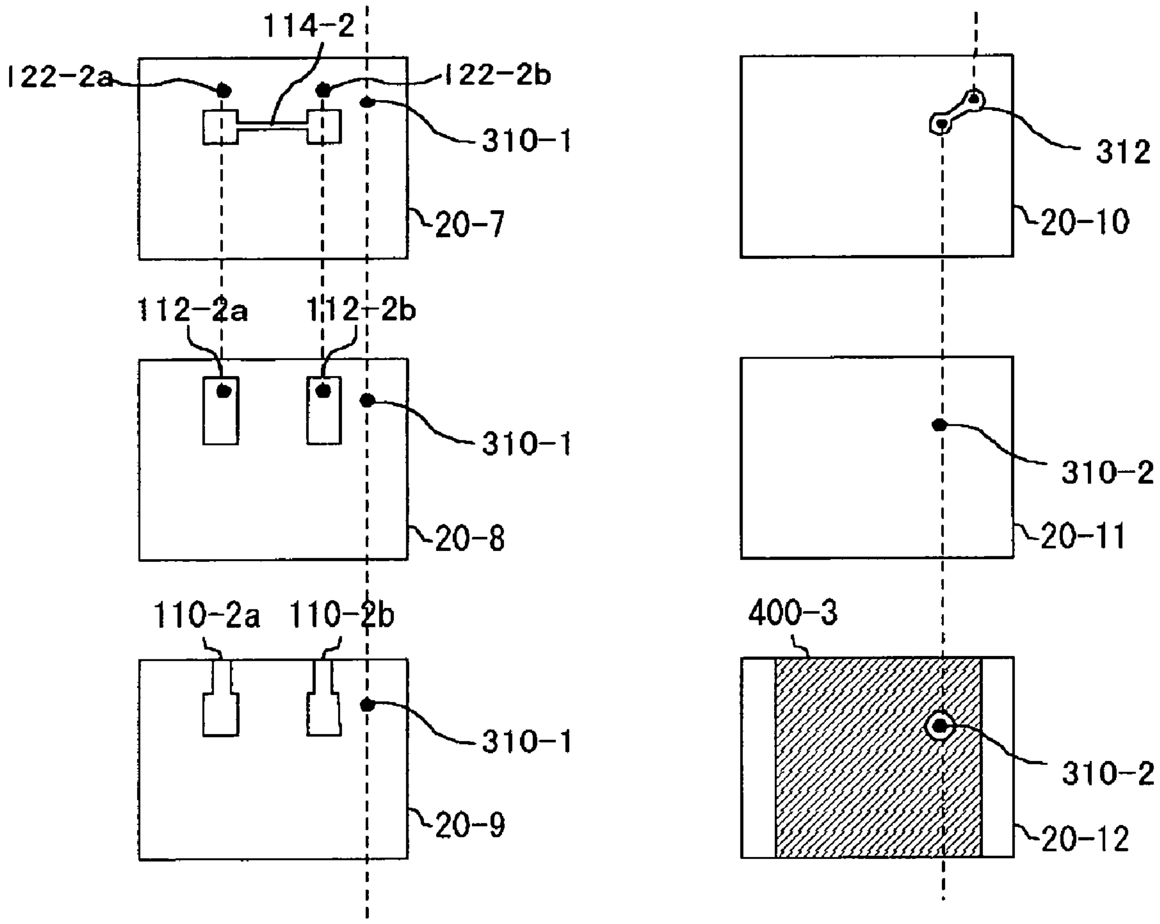
FIG. 23 is a plan view illustrating a modified example of the structure shown in FIG. 13.
Figure 24:
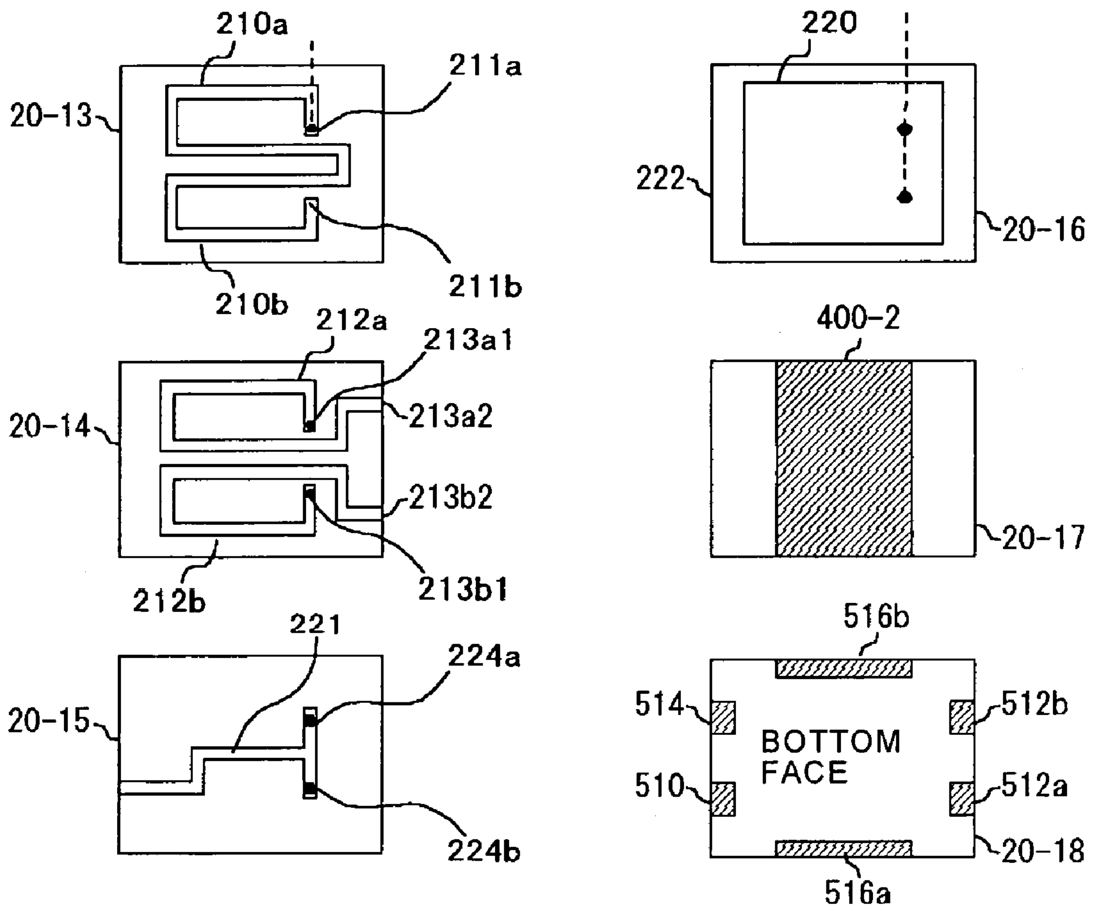
FIG. 24 is a plan view illustrating a modified example of the structure shown in FIG. 14.

FIGS. 22 through 24 are plan views illustrating other modified examples of the balance filter device 12 shown in FIGS. 12 through 14, respectively. FIGS. 22 through 24 show that various modifications can be made to the above-described embodiment. For example, as shown in FIG. 22, the end of the filter input/output electrode 118*b* may be folded, and a via-hole may be provided toward the upper layers.

As shown in FIG. 24, the shapes of the unbalanced resonance electrodes 210*a* and 210*b* and the balanced resonance electrodes 212*a* and 212*b* may be different from those shown in FIG. 14. An inductor electrode 221 may be interposed between each of the balanced resonance electrodes 212*a* and 212*b* and the intermediate electrode 220, and by connecting the inductor electrode 221 to the DC terminal 514, DC may be supplied via the inductor electrode 221 rather than the intermediate electrode 220.

The area of the intermediate electrode 220 may be formed larger than the area of the GND electrode 400-2, in other words, the area of the GND electrode 400-2 may be formed smaller than the area of the intermediate electrode 220. With this arrangement, the interference with external terminals can be prevented.

Figure 25:
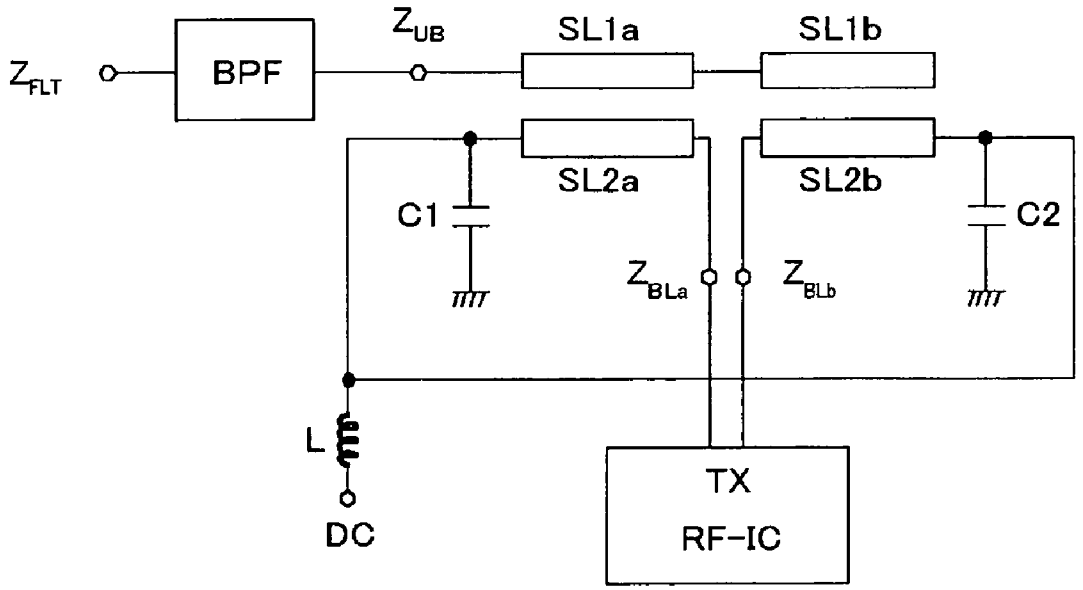
FIG. 25 is a circuit diagram illustrating an equivalent circuit of the structure shown in FIG. 22 or 24.

FIG. 25 is a circuit diagram illustrating an equivalent circuit of the structure of the balance filter device 12 shown in FIGS. 22 through 24. The inductor electrode 221 shown in FIG. 24 is equivalent to the circuit in which an inductance L is inserted into a DC supply line. The inductance L and capacitances C1 and C2 form a filter circuit, thereby eliminating undesired signals or shifting the frequency of undesired peaks.

Figure 26:
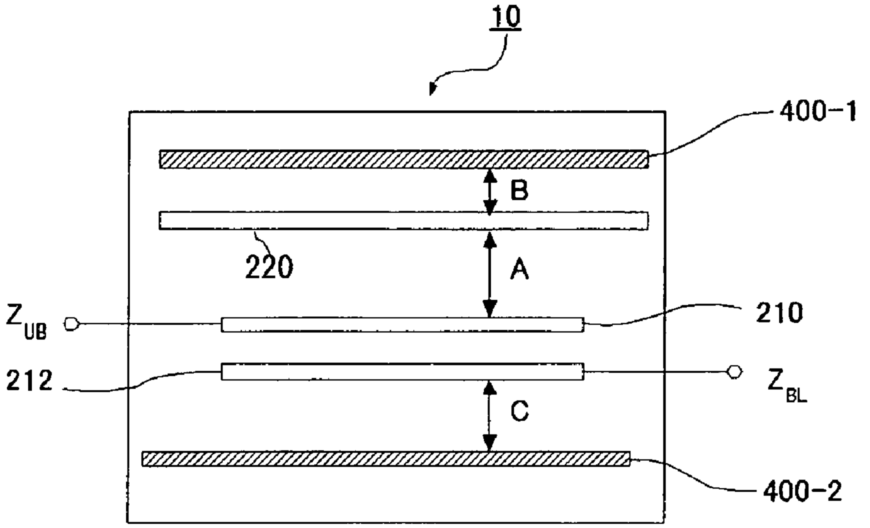
FIG. 26 is a sectional view illustrating a modified example of the structure shown in FIG. 3.

FIG. 26 is a sectional view illustrating a modified example of the structure shown in FIG. 3. FIG. 26 shows that the intermediate electrode 220 may be disposed near the unbalanced terminal 510. In this case, when the distance between the unbalanced resonance electrode 210 and the intermediate electrode 220 is indicated by A, and when the distance between the intermediate electrode 220 and the GND electrode 400-1 is represented by B, the positional relationship A>B holds true. That is, it is preferable that the intermediate electrode 220 may be disposed closer to the GND electrode 400-1 than the unbalanced resonance electrode 210. With this arrangement, the interference between the unbalanced resonance electrode 210 and the intermediate electrode 220 can be prevented.

Figure 27:
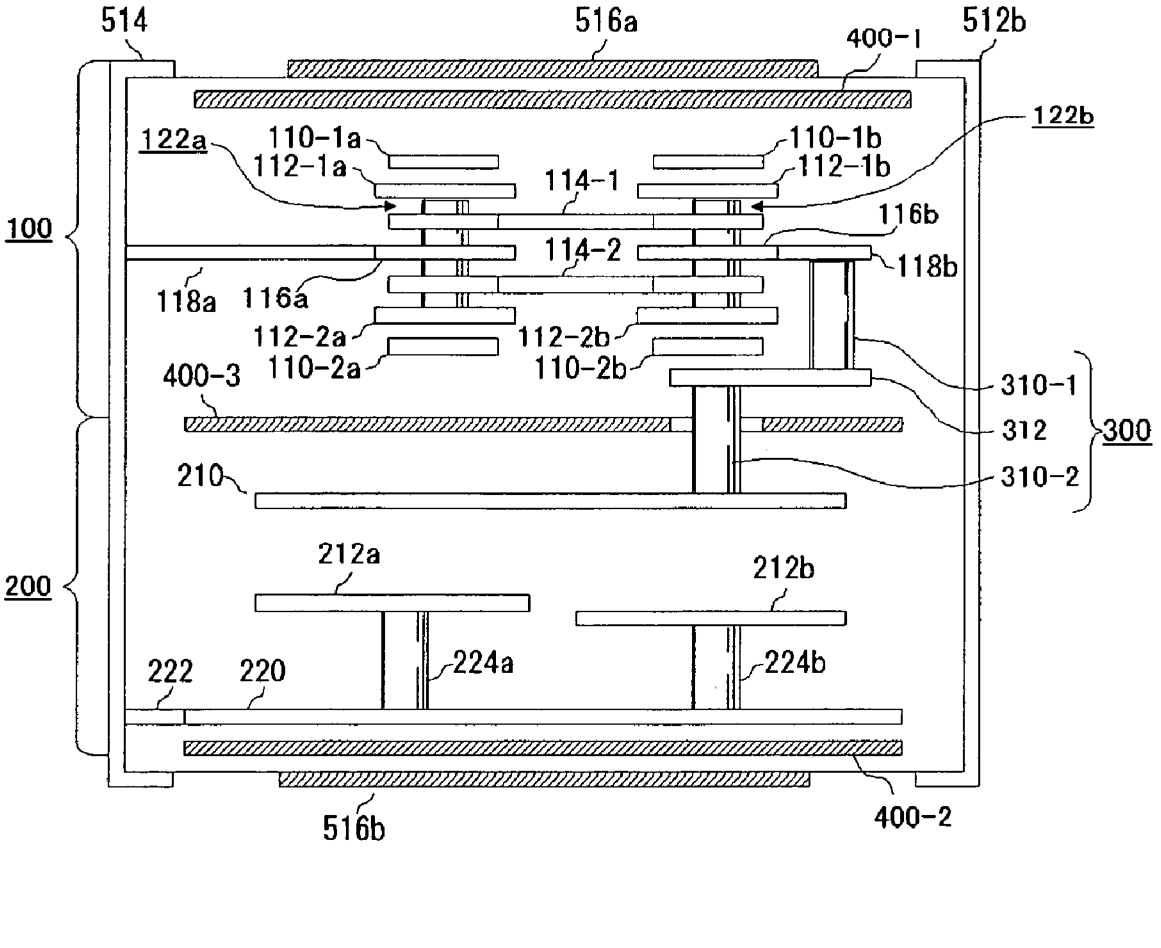
FIG. 27 is a sectional view illustrating a modified example of the structure shown in FIG. 11.

FIG. 27 is a sectional view illustrating a modified example of the balance filter device 12 shown in FIG. 11. The balanced resonance electrodes 212*a* and 212*b* may be formed on different layers so that the coupling distances of the balanced resonance electrodes 212*a* and 212*b* with the unbalanced resonance electrode 210 can be different. With this configuration, the balance between the balanced resonance electrodes 212*a* and 212*b* can be adjusted. It is thus possible to provide an optimal balance filter device having a low insertion loss.

The present application claims priority under U.S.C. 119 to Japanese Patent Application No. 2004-032306, filed Feb. 9, 2004, and No. 2004-176900, filed Jun. 15, 2004, the disclosure of which is incorporated herein by reference in their entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A balance filter device comprising:
a filter unit formed by laminating a plurality of dielectric substrates; and
a balun device comprising:
a pair of ground (GND) electrodes formed on respective dielectric layers;
an unbalanced resonance electrode formed on a dielectric layer;
a balanced resonance electrode formed on a dielectric layer, the unbalanced resonance electrode and the balanced resonance electrode being disposed between the pair of ground (GND) electrodes by laminating the dielectric layers; and
an intermediate electrode disposed between one of the unbalanced resonance electrode or the balanced electrode and the ground (GND) electrode near the one of the unbalanced resonance electrode or the balanced electrode wherein the intermediate electrode is formed larger than the ground (GND) electrode,
the filter unit being connected to the unbalanced resonance electrode of the balun unit, wherein the filter unit and the balun unit are formed of the same dielectric material.

2. A balun device comprising:
a pair of ground (GND) electrodes formed on respective dielectric layers;
an unbalanced resonance electrode formed on a dielectric layer;
a balanced resonance electrode formed on a dielectric layer, the unbalanced resonance electrode and the balanced resonance electrode being disposed between the pair of ground (GND) electrodes by laminating the dielectric layers; and
an intermediate electrode disposed between one of the unbalanced resonance electrode or the balanced electrode and the ground (GND) electrode near the one of the unbalanced resonance electrode or the balanced electrode wherein the intermediate electrode is formed larger than the ground (GND) electrode,
wherein the pair of ground (GND) electrodes and the unbalanced resonance electrode overlap each other in the laminating direction,
the pair of ground (GND) electrodes and the balanced resonance electrode overlap each other in the laminating direction,
the intermediate electrode and the unbalanced resonance electrode overlap each other in the laminating direction, and
the intermediate electrode and the balanced resonance electrode overlap each other in the laminating direction.

3. The balun device according to claim 2, wherein the intermediate electrode is configured to place intervention between the balanced resonance electrode and the ground (GND) electrode close thereto to ease resonance characteristics of a stripline structure formed by the pair of ground (GND) electrodes, the unbalanced resonance electrode, and the balanced resonance electrode.

4. The balun device according to claim 2, wherein the balanced resonance electrode comprises a pair of resonance electrodes, and the intermediate electrode is positioned to face each of the pair of resonance electrodes.

5. The balun device according to claim 2, wherein the intermediate electrode is disposed at a position closer to the ground (GND) electrode near the balanced resonance electrode than the balanced resonance electrode.

6. A balance filter device comprising:
a filter unit formed by laminating a plurality of dielectric substrates; and
the balun device of claim 2,
the filter unit being connected to the unbalanced resonance electrode of the balun unit.

7. The balance filter device according to claim 6, wherein the intermediate electrode is disposed at a position closer to the ground (GND) electrode near the balanced resonance electrode than the balanced resonance electrode.

8. The balance filter device according to claim 6, wherein the filter unit is disposed between the pair of ground (GND) electrodes.

9. A wireless communication apparatus comprising:
an antenna;
the balance filter device of claim 6; and
a radio-frequency integrated circuit being connected to the balanced resonance electrode.

10. The wireless communication apparatus according to claim 9, wherein a DC signal is supplied to the radio-frequency integrated circuit via the intermediate electrode and the balanced resonance electrode.

11. The balance filter device according to claim 6, wherein the balanced resonance electrode comprises a pair of resonance electrodes, and the intermediate electrode is positioned to face each of the pair of resonance electrodes.

12. A balun device comprising:
a pair of ground (GND) electrodes formed on respective dielectric layers;
an unbalanced resonance electrode formed on a dielectric layer;
a balanced resonance electrode composed of a pair of electrodes formed on a same dielectric layer, the unbalanced resonance electrode and the balanced resonance electrode being disposed between the pair of ground (GND) electrodes by laminating the dielectric layers; and
an intermediate electrode disposed between the unbalanced resonance electrode and the ground (GND) electrode nearer to the unbalanced resonance electrode than to the balanced resonance electrode at a position closer to the said ground (GND) electrode than to the unbalanced resonance electrode.

13. The balun device according to claim 12, wherein the balanced resonance electrode and the unbalanced resonance electrode overlap each other in the laminating direction.

14. A balance filter device comprising:
a filter unit being formed by laminating a plurality of dielectric substrates; and
the balun device of claim 12,
the filter unit being connected to the unbalanced resonance electrode of the balun unit.

15. A balun device comprising:
a pair of ground (GND) electrodes formed on respective dielectric layers;
an unbalanced resonance electrode formed on a dielectric layer;
a balanced resonance electrode formed on a dielectric layer, the unbalanced resonance electrode and the balanced resonance electrode being disposed between the pair of ground (GND) electrodes by laminating the dielectric layers;

an intermediate electrode disposed between one of the unbalanced resonance electrode or the balanced electrode and the ground (GND) electrode near the one of the unbalanced resonance electrode or the balanced electrode wherein the intermediate electrode is formed larger than the ground (GND) electrode; and an inductor electrode disposed between the balanced resonance electrode and the intermediate electrode.

16. The balun device according to claim 15, wherein the inductor electrode comprises a connecting pattern for the balanced resonance electrode and a connecting pattern for an external source.

17. A balance filter device comprising:

a filter unit formed by laminating a plurality of dielectric substrates; and the balun device of claim 15, the filter unit being connected to the unbalanced resonance electrode of the balun unit.

18. The balance filter device according to claim 17, wherein the inductor electrode comprises a connecting pattern for the balanced resonance electrode and a connecting pattern for an external source.

19. A wireless communication apparatus comprising:

an antenna;

the balance filter device of claim 17; and a radio-frequency integrated circuit.

20. The wireless communication apparatus according to claim 19, wherein a DC signal is supplied to the radio-frequency integrated circuit via the inductor electrode and the balanced resonance electrode.

* * * * *